(12) United States Patent
Yang et al.

(10) Patent No.: US 11,537,247 B2
(45) Date of Patent: Dec. 27, 2022

(54) DISPLAY DEVICE

(71) Applicant: Samsung Display Co., Ltd., Yongin-si (KR)

(72) Inventors: Sung Jin Yang, Yongin-si (KR); Hyun Sik Park, Yongin-si (KR); Tae Ik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 160 days.

(21) Appl. No.: 17/062,634

(22) Filed: Oct. 5, 2020

(65) Prior Publication Data
US 2021/0294460 A1    Sep. 23, 2021

(30) Foreign Application Priority Data

Mar. 19, 2020 (KR) .................... 10-2020-0034002

(51) Int. Cl.
*G06F 3/044* (2006.01)
*G06F 3/041* (2006.01)

(52) U.S. Cl.
CPC .......... *G06F 3/0445* (2019.05); *G06F 3/0446* (2019.05); *G06F 3/04164* (2019.05); *G06F 2203/04111* (2013.01)

(58) Field of Classification Search
CPC .. G06F 3/0445; G06F 3/0446; G06F 3/04164; G06F 2203/04111; G06F 1/1686

USPC ........................................................ 345/173
See application file for complete search history.

(56) References Cited

U.S. PATENT DOCUMENTS

| | | |
|---|---|---|
| 2011/0057893 A1 | 3/2011 | Kim et al. |
| 2015/0198756 A1* | 7/2015 | Song ................. G02F 1/133504 362/609 |
| 2017/0185184 A1 | 6/2017 | Kim |
| 2017/0287992 A1* | 10/2017 | Kwak ................. H04M 1/0264 |
| 2022/0037442 A1* | 2/2022 | Liu ..................... H01L 51/5275 |

FOREIGN PATENT DOCUMENTS

| | | |
|---|---|---|
| KR | 10-1082293 | 11/2011 |
| KR | 10-2017-0077910 | 7/2017 |

* cited by examiner

*Primary Examiner* — Mark Edwards
(74) *Attorney, Agent, or Firm* — H.C. Park & Associates, PLC

(57) ABSTRACT

Provided herein is a display device including a base layer having a non-sensing area and a sensing area configured to surround the non-sensing area, a touch sensor disposed on the sensing area of the base layer, an optical structure disposed on the base layer, and a polarization layer disposed on the touch sensor so as to overlap the sensing area. The touch sensor and the optical structure include a first through hole located in the non-sensing area, and the non-sensing area includes a first area corresponding to the first through hole and a second area configured to surround the first area. The optical structure is disposed in the second area, and includes an optical pattern including a plurality of openings.

20 Claims, 15 Drawing Sheets

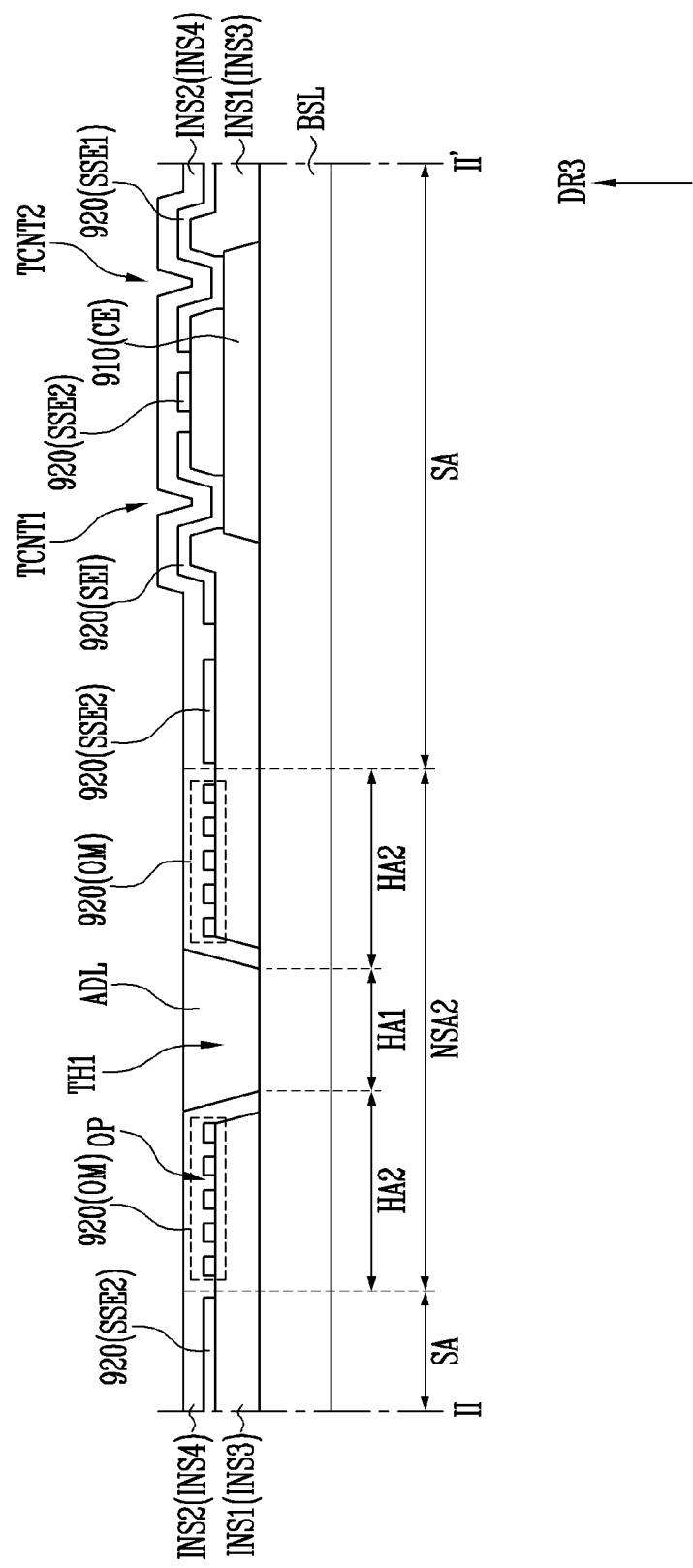

DISPLAY DEVICE

CROSS-REFERENCE TO RELATED APPLICATION

This application claims priority from and the benefit of Korean Patent Application No. 10-2020-0034002, filed on Mar. 19, 2020, which is hereby incorporated by reference for all purposes as if fully set forth herein.

BACKGROUND

Field

Exemplary embodiments/implementations of the invention relate generally to a display device.

Discussion of the Background

A display device may include a display panel and a touch sensor disposed so as to overlap the display panel. For example, the touch sensor may be attached to one surface of the display panel, or a touch sensor produced to be integrated with the display panel may be used. These days, technology to dispose a sensor module, including a camera device and the like, in a display area is being researched in order to minimize a non-display area, such as the bezel of the display device and the like.

SUMMARY

Various embodiments of the inventive concepts are directed to a display device capable of decreasing the reflectivity of light incident to the periphery of the hole of a touch sensor.

Additional features of the inventive concepts will be set forth in the description which follows, and in part will be apparent from the description, or may be learned by practice of the inventive concepts.

An embodiment of the inventive concepts may provide for a display device. The display device may include a base layer including a non-sensing area and a sensing area configured to surround the non-sensing area, a touch sensor disposed on the sensing area of the base layer, an optical structure disposed on the base layer, and a polarization layer disposed on the touch sensor so as to overlap the sensing area. The touch sensor and the optical structure may define a first through hole located in the non-sensing area, and the non-sensing area may include a first area corresponding to the first through hole and a second area configured to surround the first area. The optical structure may include an optical pattern disposed in the second area and including a plurality of openings.

In an embodiment, the touch sensor may include a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer. The first sensing electrodes adjacent to each other, among the first sensing electrodes, may be coupled to the second electrode layer by penetrating through the first insulation layer, and the optical pattern may be disposed on a layer identical to the second electrode layer.

In an embodiment, the optical structure may further include a third insulation layer disposed on the second area of the base layer. The first insulation layer and the third insulation layer may be formed as a single body, and the optical pattern may be disposed on the third insulation layer.

In an embodiment, the optical structure may further include a fourth insulation layer configured to cover the optical pattern. The second insulation layer and the fourth insulation layer may be formed as a single body, and the refractive index of the fourth insulation layer may be lower than the refractive index of the optical pattern.

In an embodiment, the second electrode layer and the optical pattern may include an identical metal material.

In an embodiment, the optical structure may further include a metal layer disposed on the second area of the base layer and a third insulation layer configured to cover the metal layer. The first insulation layer and the third insulation layer may be formed as a single body, and the metal layer may be disposed on a layer identical to the first electrode layer.

In an embodiment, the optical structure may further include a fourth insulation layer configured to cover the optical pattern. The second insulation layer and the fourth insulation layer may be formed as a single body.

In an embodiment, the optical structure may further include a first metal oxide film disposed between the base layer and the metal layer and a second metal oxide film disposed between the metal layer and the third insulation layer.

In an embodiment, the first electrode layer and the metal layer may include an identical metal material.

In an embodiment, the first metal oxide film, the second metal oxide film, and the metal layer may include an identical metal material.

In an embodiment, the touch sensor may include a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer. The first sensing electrodes adjacent to each other, among the first sensing electrodes, may be coupled to the second electrode layer by penetrating through the first insulation layer, and the optical pattern may be formed on a layer identical to the second insulation layer.

In an embodiment, the optical structure may further include a metal layer disposed on the second area of the base layer and a capping layer configured to cover the metal layer. The metal layer may be disposed on a layer identical to the first electrode layer, the capping layer may be disposed on a layer identical to the second electrode layer, the optical pattern may be disposed on the capping layer, and the second insulation layer and the optical pattern may include an identical material.

In an embodiment, the display device may further include a window layer disposed on the polarization layer and the touch sensor and an adhesive layer configured to bond the polarization layer to the window layer in the sensing area and to bond the optical structure to the window layer in the non-sensing area.

In an embodiment, the adhesive layer may cover the optical pattern, and the refractive index of the adhesive layer may be lower than the refractive index of the optical pattern.

In an embodiment, the display device may further include a window layer disposed on the polarization layer so as to overlap the sensing area and an adhesive layer configured to bond the polarization layer to the window layer. At least a part of the optical pattern may be exposed to the outside.

In an embodiment, the display device may further include a substrate including a non-display area corresponding to the non-sensing area and a display area corresponding to the sensing area, a display element layer disposed between the first surface of the substrate and the base layer and configured to define a second through hole corresponding to the first through hole, and a sensor module disposed on the second surface facing the first surface of the substrate so as to correspond to at least a part of the first area.

An embodiment of the inventive concepts may provide for a display device. The display device may include a base layer including a non-sensing area and a sensing area configured to surround the non-sensing area, a touch sensor disposed on the sensing area of the base layer, an optical structure disposed on the base layer, and a polarization layer disposed on the touch sensor so as to overlap the sensing area. The touch sensor and the optical structure may define a first through hole located in the non-sensing area, and the non-sensing area may include a first area corresponding to the first through hole and a second area configured to surround the first area. The optical structure may include a first metal oxide film disposed on the first area of the base layer, a metal layer disposed on the first metal oxide film, and a second metal oxide film disposed on the metal layer.

In an embodiment, the touch sensor may include a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer. The first sensing electrodes adjacent to each other, among the first sensing electrodes, may be coupled to the second electrode layer by penetrating through the first insulation layer, and the metal layer, the first metal oxide film, and the second metal oxide film may be disposed on a layer identical to the first electrode layer.

In an embodiment, the optical structure may further include a third insulation layer disposed on the second area of the base layer. The first insulation layer and the third insulation layer may be formed as a single body, and the third insulation layer may cover the second metal oxide film.

In an embodiment, the metal layer, the first metal oxide film, the second metal oxide film, and the first electrode layer may include an identical metal material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 9A to 9E are cross-sectional views schematically illustrating examples of the enlarged area EA part of FIG. 8, taken along line II-II'.

DETAILED DESCRIPTION

Figure 1:
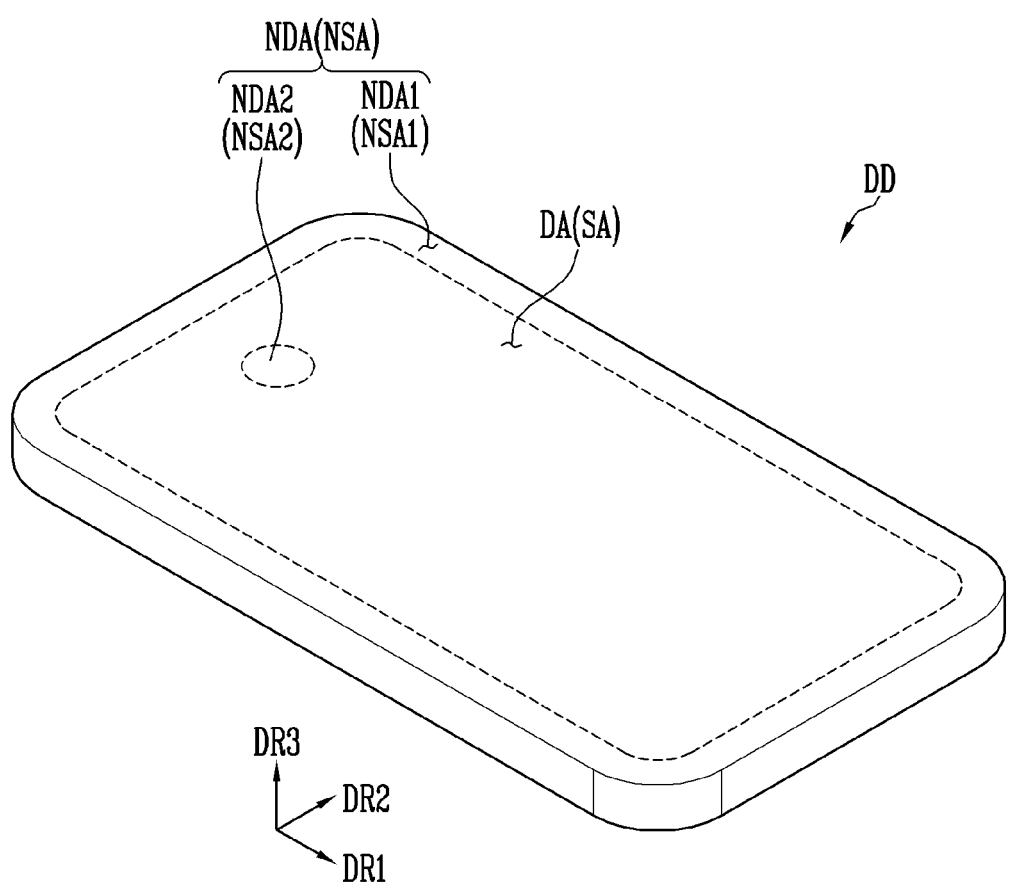
FIG. 1 is a perspective view illustrating a display device according to embodiments of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order.

For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
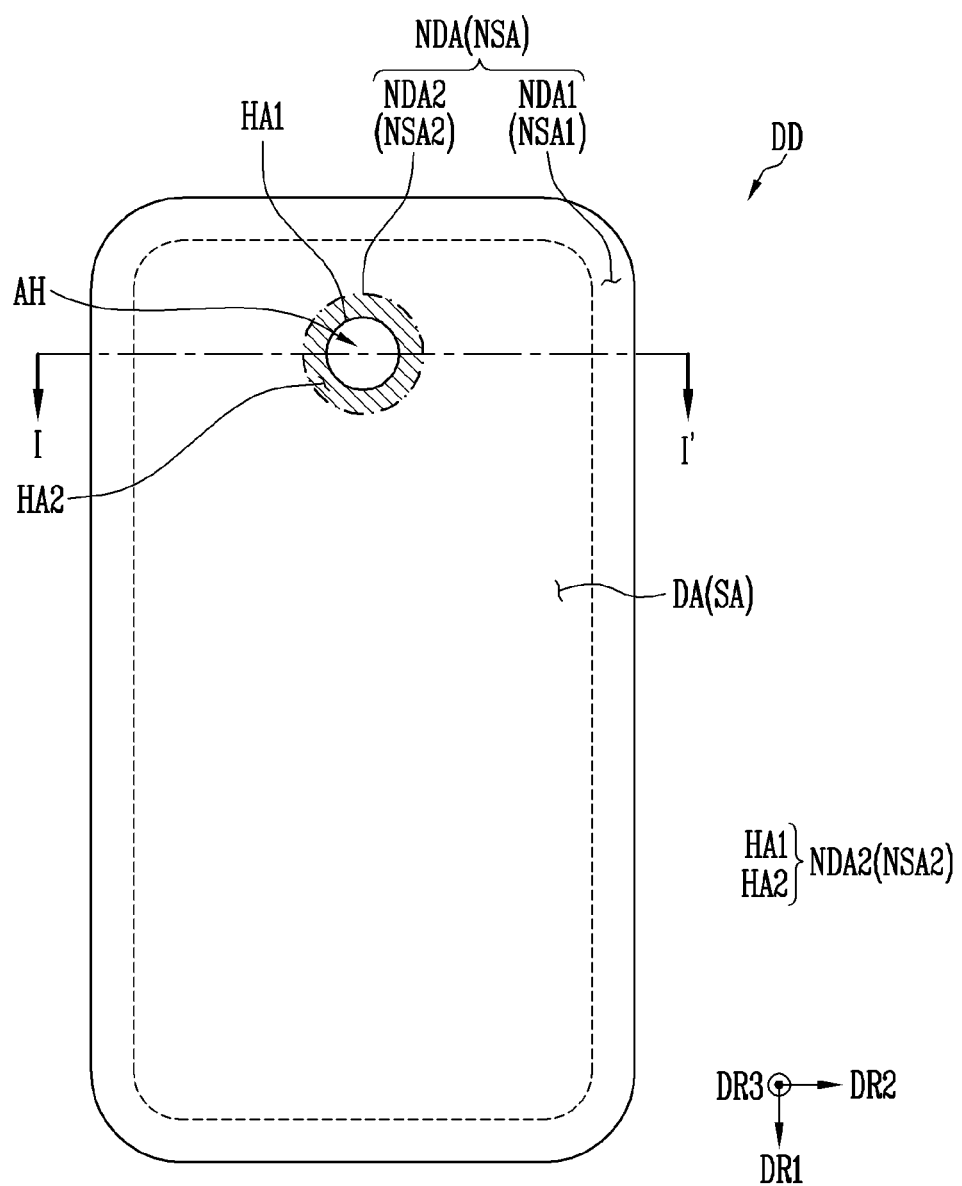
FIG. 2 is a top plan view illustrating an example of the display device of FIG. 1.

FIG. 1 is a perspective view illustrating a display device according to embodiments of the inventive concepts, and FIG. 2 is a top plan view illustrating an example of the display device of FIG. 1.

Referring to FIG. 1 and FIG. 2, a display device DD may include a display area DA and a non-display area NDA.

The display area DA is defined as an area in which an image is displayed. The display device DD may include a display panel, and the display panel may include a plurality of pixels in the display area DA.

The display device DD may display an image through the display area DA (or a front display surface). The display area DA may be parallel to a surface defined by a first directional axis (that is, an axis extending in a first direction DR1) and a second directional axis (that is, an axis extending in a second direction DR2). The normal line direction of the display surface, that is, the thickness direction of the display device DD, may be defined as a third direction DR3.

The front surface (or the upper surface) and the back surface (or the lower surface) of each of the respective members or units of the display device DD to be described below may be identified based on the third direction DR3. However, the first to third directions DR1, DR2 and DR3 illustrated in the present embodiment are merely examples. The first to third directions DR1, DR2 and DR3 are relative concepts, and may be changed to other directions. Hereinafter, the first to third directions DR1, DR2 and DR3 will be designated by the same reference numerals.

In an embodiment, the display device DD may include a planar display area DA, but is not limited thereto. For example, the display device DD may include a curved display area or a stereoscopic display area.

Also, the display area DA is used not only as an area to display an image but also as an area configured to recognize a touch input by a user, that is, a sensing area SA. To this end, the display device DD may include a touch sensor.

Here, the sensing area SA corresponds to the display area DA, and may overlap at least a part of the display area DA.

The non-display area NDA is defined as an area in which no image is displayed. The non-display area NDA may include a first non-display area NDA1 configured to surround the outside of the display area DA and a second non-display area NDA2 disposed in the display area DA.

In an embodiment, an area in which a touch input by a user is not recognized, that is, a non-sensing area NSA, corresponds to the non-display area NDA, and may overlap the non-display area NDA. Also, the non-sensing area NSA may include a first non-sensing area NSA1 and a second non-sensing area NSA2. The first non-sensing area NSA1 may correspond to the first non-display area NDA1, and the second non-sensing area NSA2 may correspond to the second non-display area NDA2.

The first non-display area NDA1 may be located outside the display area DA. However, without limitation thereto, the shape of the display area DA and the shape of the first non-display area NDA1 may be designed to be relative to each other.

In an embodiment, the display device DD may include the second non-display area NDA2 formed to be surrounded by the display area DA. That is, the second non-display area NDA2 may be located inside the display area DA. The second non-display area NDA2 includes a hole AH, and is defined as an area in which no image is displayed.

In an embodiment, the second non-display area NDA2 may include a first area HA1 corresponding to the hole AH and a second area HA2 configured to surround the first area HA1.

In an embodiment, an optical pattern may be disposed in at least a part of the second area HA2. The optical pattern is included in an optical structure, and may include a plurality of openings. The optical pattern will be described later with reference to FIGS. 7 to 9E.

The hole AH may have a circular shape on the flat surface. However, without limitation thereto, the hole may have any of various shapes. For example, the hole AH may have a polygonal shape, including a flat rectangle, or an atypical shape.

The hole AH may include a first through hole and a second through hole. Here, the first through hole may be a part corresponding to the touch sensor of the hole AH, and the second through hole may be a part corresponding to the display panel of the hole AH.

A sensor module may be disposed at the lower side of the display device DD (e.g., on the back surface facing the front surface of the display panel) so as to correspond to the hole AH. That is, the sensor module may be disposed so as to overlap the hole AH from the lower side of the display device DD. In an embodiment, the sensor module may include at least one of an image sensor (or a camera), an illumination sensor, a proximity sensor, an infrared sensor, and an ultrasonic sensor.

In the present specification, the term "overlap" indicates that two components each have portions along a direction when viewed from the thickness direction of the display device DD (that is, the third direction DR3) unless it is differently defined.

As described above with reference to FIG. 1 and FIG. 2, the display device DD includes the hole AH formed in the second non-display area NDA2 (or the second non-sensing area NSA2), and the sensor module, including a camera or the like, is disposed so as to overlap the hole AH. Accordingly, the display device DD may have a minimized dead space, compared to another display device in which a sensor module is disposed at only one side of the display area DA (e.g., the first non-display area NDA1).

Figure 3:
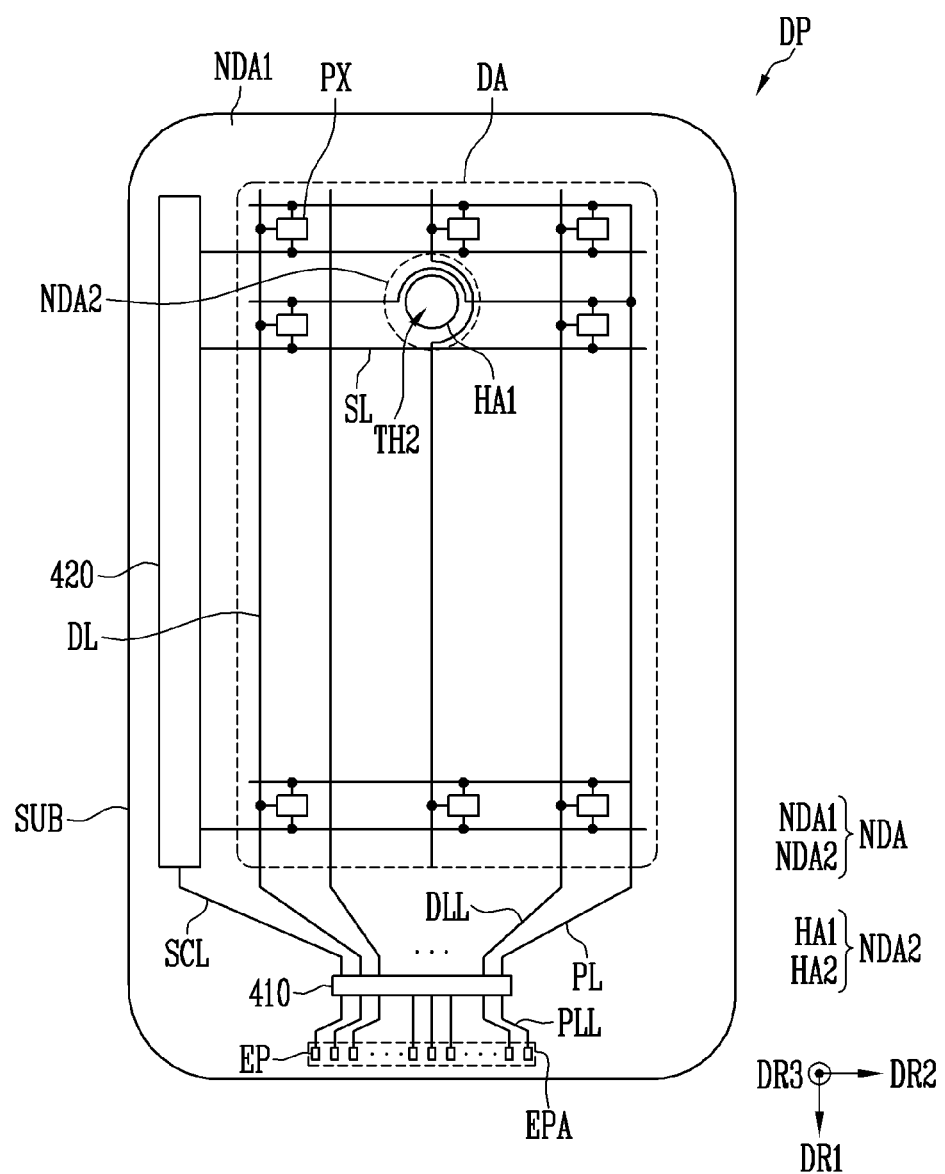
FIG. 3 is a top plan view illustrating a display panel included in the display device of FIG. 2.

FIG. 3 is a top plan view illustrating a display panel included in the display device of FIG. 2.

Referring to FIGS. 1 to 3, a display panel DP may include a substrate SUB, a pixel PX, a scan line SL, a data line DL, a power line PL, a scan control line SCL, a scan driver 420, a display driving circuit 410, a display electrode pad EP, a data coupling line DLL, and a pad coupling line PLL. Also, the display panel DP may define a second through hole TH2.

Here, the second through hole TH2 may be a part corresponding to the display panel DP of the hole AH described with reference to FIG. 1 and FIG. 2. The second through hole TH2 may be formed so as to correspond to the first area HA1 of a second non-display area NDA2.

The display panel DP may include a display area DA, a first non-display area NDA1, and the second non-display area NDA2. The pixels PX may be disposed in the display area DA.

The display panel DP may include the scan line SL, the data line DL, the power line PL, and the pixel PX.

In an embodiment, the scan line SL may extend in the second direction DR2, and the data line DL may extend in the first direction DR1. The power line PL may include at least one line extending in the first direction DR1 and a plurality of lines branching from the at least one line and extending in the second direction DR2.

Each of the pixels PX may be coupled to at least one of the scan lines SL, any one of the data lines DL, and the power line PL. Each of the pixels PX may include a driving transistor, at least one switching transistor, a light-emitting element, a capacitor, and the like.

In an embodiment, the display panel DP may further include the display driving circuit 410, the scan driver 420, the scan control line SCL, the data coupling line DLL, and the pad coupling line PLL. The display driving circuit 410, the scan driver 420, the scan control line SCL, the data coupling line DLL, and the pad coupling line PLL may be disposed in the first non-display area NDA1.

Although the scan driver 420 is illustrated as being disposed in the first non-display area NDA1 outside one side of the display area DA in FIG. 3, the disposition thereof is not limited thereto. For example, the scan driver 420 may be disposed in the first non-display area NDA1 outside the opposite sides of the display area DA.

The display driving circuit 410 may be coupled to the display electrode pad EP of a display pad area EPA through the pad coupling line PLL. The display driving circuit 410 may supply a data signal to the data line DL through the data coupling line DLL. Also, the display driving circuit 410 may generate a scan control signal configured to control the scan driver 420 through the scan control line SCL and supply the same to the scan driver 420.

In an embodiment, the display driving circuit 410 is formed as an integrated circuit (IC), thereby being bonded to the substrate SUB using a chip-on-glass (COG) method, a chip-on-plastic (COP) method, an ultrasonic bonding method, or the like.

Figure 4:
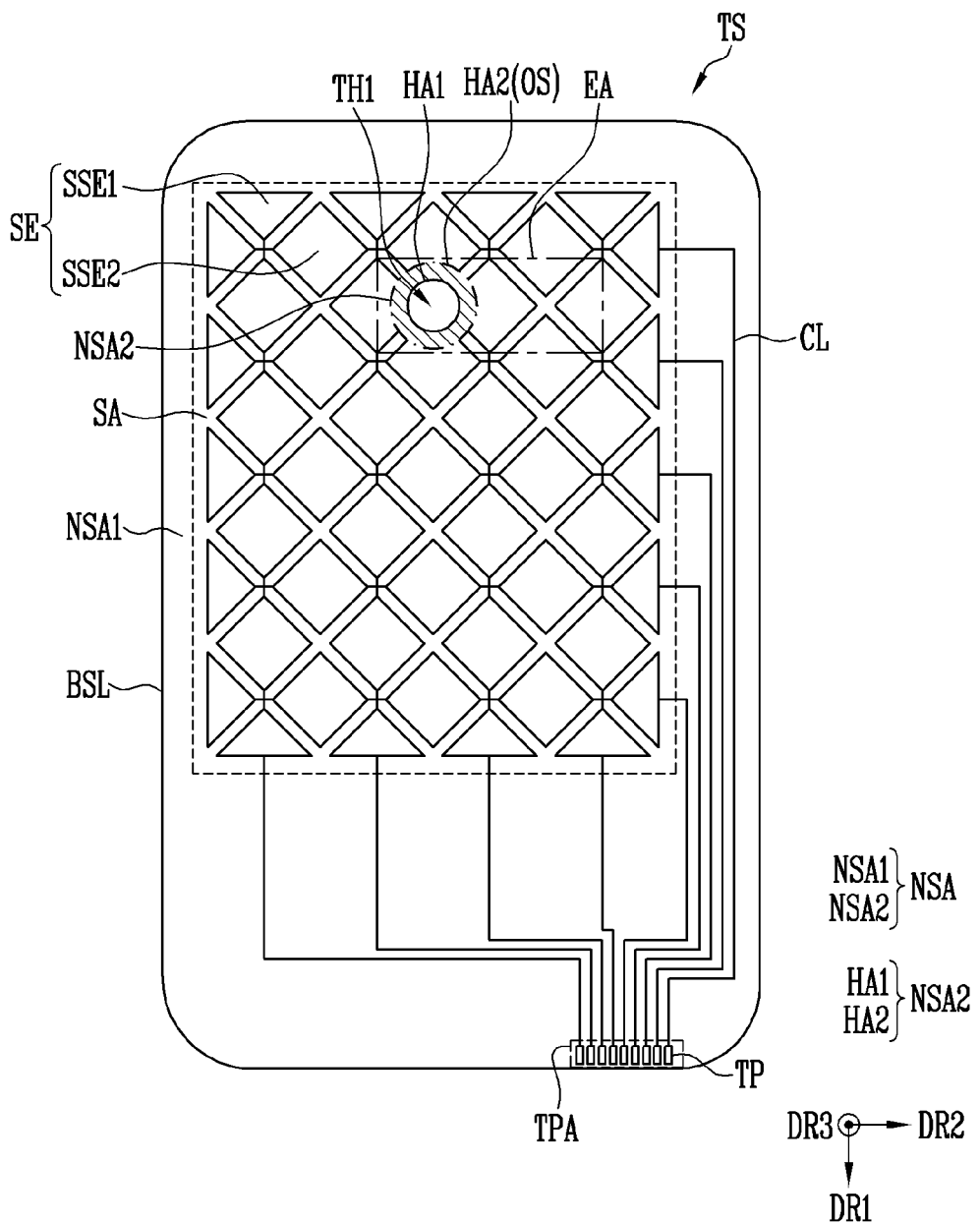
FIG. 4 is a top plan view illustrating a touch sensor, an optical structure, and a base layer included in the display device of FIG. 2.

FIG. 4 is a top plan view illustrating a touch sensor, an optical structure, and a base layer included in the display device of FIG. 2.

Referring to FIGS. 2 to 4, a touch sensor TS may be disposed on a display panel DP (that is, on the front surface of the display panel DP). However, without limitation thereto, the touch sensor TS and the display panel DP may be produced as a single body.

The touch sensor TS may be disposed on the sensing area SA of a base layer BSL. The touch sensor TS may include a sensing electrode SE, a signal line CL, and a touch electrode pad TP. Also, the touch sensor TS and an optical structure OS may define a first through hole TH1.

Here, the first through hole TH1 may be a part corresponding to the touch sensor TS of the hole AH described with reference to FIG. 1 and FIG. 2. The first through hole TH1 may be formed so as to correspond to the first area HA1 of a second non-sensing area NSA2. The first through hole TH1 may be formed within the first area HA1.

The base layer BSL may include the sensing area SA in which a touch by a user is recognized and a non-sensing area NSA in which a touch by a user is not recognized. In an embodiment, the base layer BSL may be the encapsulation layer of the display panel DP. In this case, the touch sensor TS may be disposed directly on the display panel DP. In another embodiment, the base layer BSL may be a component separate from the display panel DP, in which case the base layer BSL may be bonded to the upper surface of the display panel DP by a predetermined transparent adhesive member.

The non-sensing area NSA may include a first non-sensing area NSA1 and the second non-sensing area NSA2.

The first non-sensing area NSA1 is the peripheral area of the sensing area SA, and may be defined as an area from the outside of the sensing area SA to the boundary of the base layer BSL.

The second non-sensing area NSA2 is disposed in the sensing area SA, and may be formed so as to be surrounded by the sensing area SA. The second non-sensing area NSA2 may include the first area HA1 corresponding to the first through hole TH1 and a second area HA2 formed so as to surround the first area HA1.

A plurality of sensing electrodes SE may be provided in the sensing area SA, and the touch electrode pads TP of a touch pad area TPA and the signal lines CL configured to couple the sensing electrodes SE to the touch electrode pads TP may be provided in the first non-sensing area NSA1.

The sensing electrode SE may include first sensing electrodes SSE1 arranged in the first direction DR1. The first sensing electrodes SSE1 may be electrically coupled to each other. For example, the first sensing electrodes SSE1 may form a first sensing electrode line extending in the first direction DR1.

The sensing electrode SE may further include second sensing electrodes SSE2 arranged along the second direction DR2. The second sensing electrodes SSE2 may be electrically coupled along the second direction DR2. For example, the second sensing electrodes SSE2 may form a second sensing electrode line extending in the second direction DR2.

The first and second sensing electrodes SSE1 and SSE2 are illustrated as having diamond shapes in FIG. 4, but without limitation thereto, the first and second sensing electrodes SSE1 and SSE2 may have other polygonal shapes.

According to embodiments, at least some of the first and second sensing electrodes SSE1 and SSE2 may have a mesh shape in which micropatterns alternate. In this case, a decrease in the opening ratio and the transmittance of the display device, caused by the sensing electrode SE, may be prevented.

The first sensing electrode lines (e.g., sensing electrode columns) and the second sensing electrode lines (e.g., sensing electrode rows) may be coupled to the respective touch electrode pads TP through the respective signal lines CL. In an embodiment, one of the sensing electrode row and the sensing electrode column may receive a driving signal configured to sense a touch through the signal line CL, and the other one may transmit a touch sensing signal through the signal line CL.

The touch electrode pads TP are coupled to an external driving circuit (not illustrated), such as a position detection circuit, and the sensing electrode SE and the external driving circuit may be electrically coupled to each other.

Figure 5:
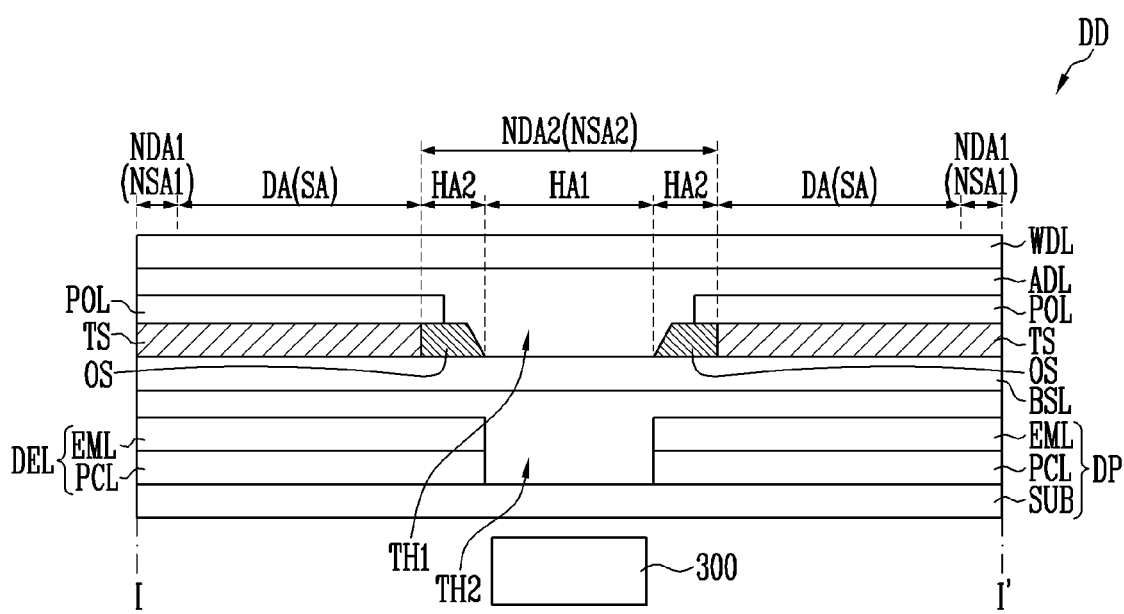
FIG. 5 is a cross-sectional view schematically illustrating an example of the part taken along line I-I' in the display device of FIG. 2.
Figure 5:
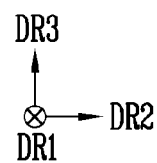

FIG. 5 is a cross-sectional view schematically illustrating an example of a part of the display device of FIG. 2, taken along line I-I'.

Referring to FIGS. 2 to 5, a display device DD may include a display panel DP, a base layer BSL, a touch sensor TS, an optical structure OS, a polarization layer POL, a window layer WDL, an adhesive layer ADL, and a sensor module 300.

The display panel DP may include a substrate SUB and a display element layer DEL.

The substrate SUB may be a rigid substrate or a flexible substrate capable of bending, folding, rolling, or the like. The substrate SUB may be formed of an insulation material such as glass, quartz, polymer resin, or the like. An example of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Alternatively, the substrate SUB may include a metallic material.

The display element layer DEL is disposed on the substrate SUB, and may include a pixel circuit layer PCL and an emission element layer EML.

The pixel circuit layer PCL may be disposed on the substrate SUB. On the pixel circuit layer PCL, not only the transistor of each of the pixels PX but also a scan line SL, a data line DL, a power line PL, a scan control line SCL, a data coupling line DLL, a pad coupling line PLL, and the like may be disposed. Each transistor may include a gate electrode, a semiconductor layer, a source electrode, and a drain electrode.

The emission element layer EML may be disposed on the pixel circuit layer PCL.

In an embodiment, the emission element layer EML may include pixels PX, configured to emit light through a first electrode, a light-emitting layer, and a second electrode that are sequentially stacked, and a pixel definition layer configured to define the pixels PX. The pixels PX of the emission element layer EML may be disposed in a display area.

The light-emitting layer may be an organic light-emitting layer including an organic material. In this case, the light-emitting layer may include a hole transporting layer, an organic light-emitting layer, and an electron transporting layer.

In an embodiment, the emission element layer EML may include an inorganic light-emitting element. In this case, the first electrode and the second electrode are disposed on the same layer, and the inorganic light-emitting element may be electrically coupled to the first electrode and the second electrode.

In an embodiment, the display panel DP (or the display element layer DEL) may define a second through hole TH2. For example, the second through hole TH2 may be formed by penetrating through the pixel circuit layer PCL and the emission element layer EML so as to correspond to a first area HA1. In this case, the substrate SUB does not include a hole, and may cover the first area HA1. However, without limitation thereto, the second hole TH2 may be formed by penetrating through the substrate SUB.

The base layer BSL may be a rigid substrate or a flexible substrate capable of bending, folding, rolling, or the like. The base layer BSL may be formed of an insulation material, such as glass, quartz, polymer resin, or the like. An example of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Alternatively, the base layer BSL may include a metallic material.

In an embodiment, the base layer BSL may function as an encapsulation layer configured to encapsulate the emission element layer EML.

The touch sensor TS may be disposed on the sensing area SA of the base layer BSL. The touch sensor TS may include the sensing electrode SE configured to sense a touch by a user using a capacitance method, the touch electrode pad TP, and the signal line CL configured to couple the touch electrode pad TP to the sensing electrode SE, which were described with reference to FIG. 4. For example, the touch sensor TS may sense a touch by the user using a self-capacitance method or a mutual capacitance method.

In an embodiment, the touch sensor TS may define the first through hole TH1. For example, the first through hole TH1 may be formed by penetrating through the touch sensor TS so as to correspond to the first area HA1. In this case, the base layer BSL does not include the hole, and may cover the first area HA1. However, without limitation thereto, the first through hole TH1 may be formed by penetrating through the base layer BSL. The first through hole TH1 may have a same circumference and radius as the second through hole TH2. The circumference and radius may substantially match the size of the first area HA1.

The polarization layer POL and the window layer WDL may be disposed on the touch sensor TS. The polarization layer POL may be disposed on the touch sensor TS and a part of the optical structure OS, and the window layer WDL may be bonded to the polarization layer POL, the touch sensor TS, and the optical structure OS by the adhesive layer ADL. Here, optical clear adhesive (OCA) or optical clear resin (OCR) may be used as the adhesive layer ADL.

The first through hole TH1 may extend through the adhesive layer ADL, polarization layer POL, and touch sensor TS. The first through hole TH1 may taper along edges of the optical structure OS in the touch sensor TS layer. The first through hole TH1 may be wider in the polarization layer POL than in the touch sensor layer TS.

In an embodiment, the optical structure OS may be further disposed on the second area HA2 of the base layer BSL.

In an embodiment, the optical structure OS may include an optical pattern disposed in at least a part of the second area HA2. The optical pattern may include a plurality of openings. The optical pattern may be formed in at least a part of the second area HA2 such that a plurality of lines detouring around the hole AH in the second area HA2 (or the display area DA adjacent to the second area HA2) are prevented from being visible to a user. The optical pattern will be described later with reference to FIGS. 7 to 9E.

The polarization layer POL may be of a film type or a liquid crystal coating type. The film type may include a stretch-type synthetic resin film, and the liquid crystal coating type may include liquid crystals arranged in a predetermined array.

In an embodiment, the polarization layer POL may be disposed so as to overlap the sensing area SA (or the display area DA). Also, the polarization layer POL may be disposed so as to overlap at least a part of a second non-sensing area NSA2 (or a second non-display area NDA2).

The window layer WDL is disposed on the polarization layer POL, the touch sensor TS, and the optical structure OS, thereby protecting the display panel DP or the touch sensor TS from external scratches or the like. The front surface (or the upper surface) of the window layer WDL may be a surface that comes into contact with the input means (a finger) of a user.

The window layer WDL does not include the hole AH, and may cover the first area HA1 and the second area HA2. However, without limitation thereto, the hole AH may be formed by penetrating through the window layer WDL.

Although the space between the emission element layer EML and the base layer BSL is illustrated as being empty in FIG. 5, embodiments of the inventive concepts are not limited thereto. For example, a filling film may be disposed between the emission element layer EML and the base layer BSL. The filling film may be an epoxy filling film, a silicon filling film, or the like.

The sensor module 300 may be disposed under the display panel DP (or the substrate SUB) (e.g., on the back surface of the display panel DP). That is, the sensor module 300 may be disposed so as to overlap the first through hole TH1 and the second through hole TH2. Accordingly, a light receiver, such as a camera or the like included in the sensor module, may receive light from the outside through the hole AH. To this end, the substrate SUB, the base layer BSL, and the window layer WDL, which include no hole, may be formed so as to be transparent.

Figure 6:
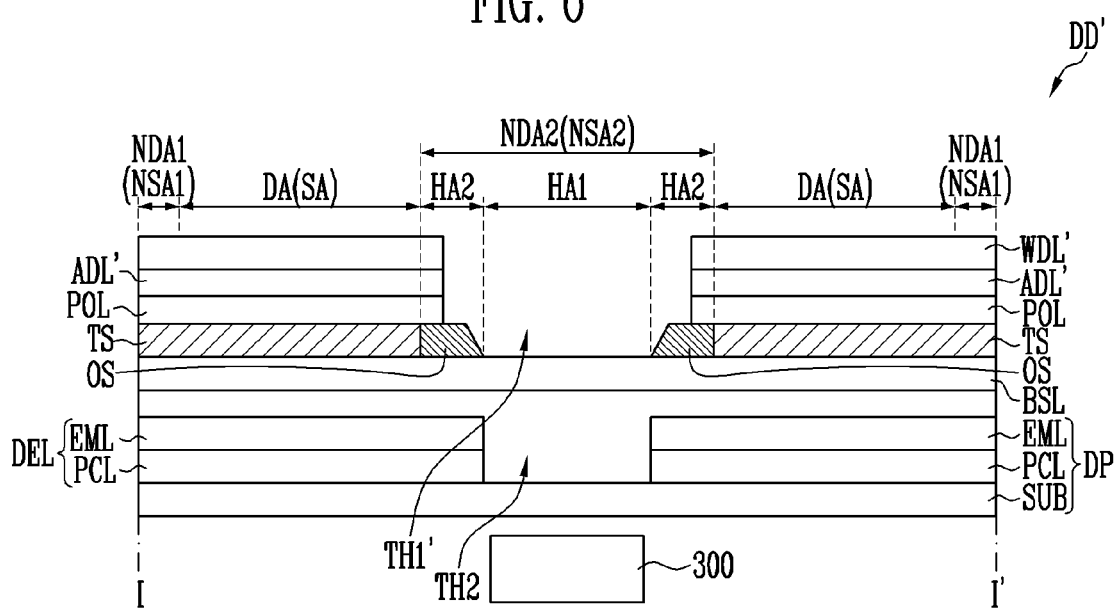
FIG. 6 is a cross-sectional view schematically illustrating another example of the part taken along line I-I' in the display device of FIG. 2.

FIG. 6 is a cross-sectional view schematically illustrating another example of a part of the display device of FIG. 2, taken along line I-I'.

Referring to FIG. 5 and FIG. 6, the display device DD' of FIG. 6 is the same as or similar to the display device DD of FIG. 5 except that the adhesive layer ADL' and the window layer WDL' of FIG. 6 are not disposed throughout the entire second non-display area NDA2. Therefore, a repeated description will be omitted.

Referring to FIG. 2 and FIG. 6, the display device DD' may include a display panel DP, a base layer BSL, a touch sensor TS, an optical structure OS, a polarization layer POL, a window layer WDL', an adhesive layer ADL', and a sensor module 300.

In an embodiment, the window layer WDL' may include a hole AH', which includes first through hole TH1' and second through hole TH2'. That is, the hole AH' (or a first through hole TH1') may be formed by penetrating through the window layer WDL'. Also, the window layer WDL' may be bonded to the polarization layer POL by the adhesive layer ADL'.

Here, the polarization layer POL is disposed so as to overlap a sensing area SA (or a display area DA), whereby the window layer WDL' and the adhesive layer ADL' may also be disposed so as to overlap the sensing area SA (or the display area DA). Also, when the polarization layer POL is disposed so as to overlap at least a part of a second non-sensing area NSA2 (or a second non-display area NDA2), the window layer WDL' and the adhesive layer ADL' may also be disposed so as to overlap at least a part of the second non-sensing area NSA2 (or the second non-display area NDA2). Accordingly, at least a part of the optical structure OS may be exposed to the outside.

Figure 7:
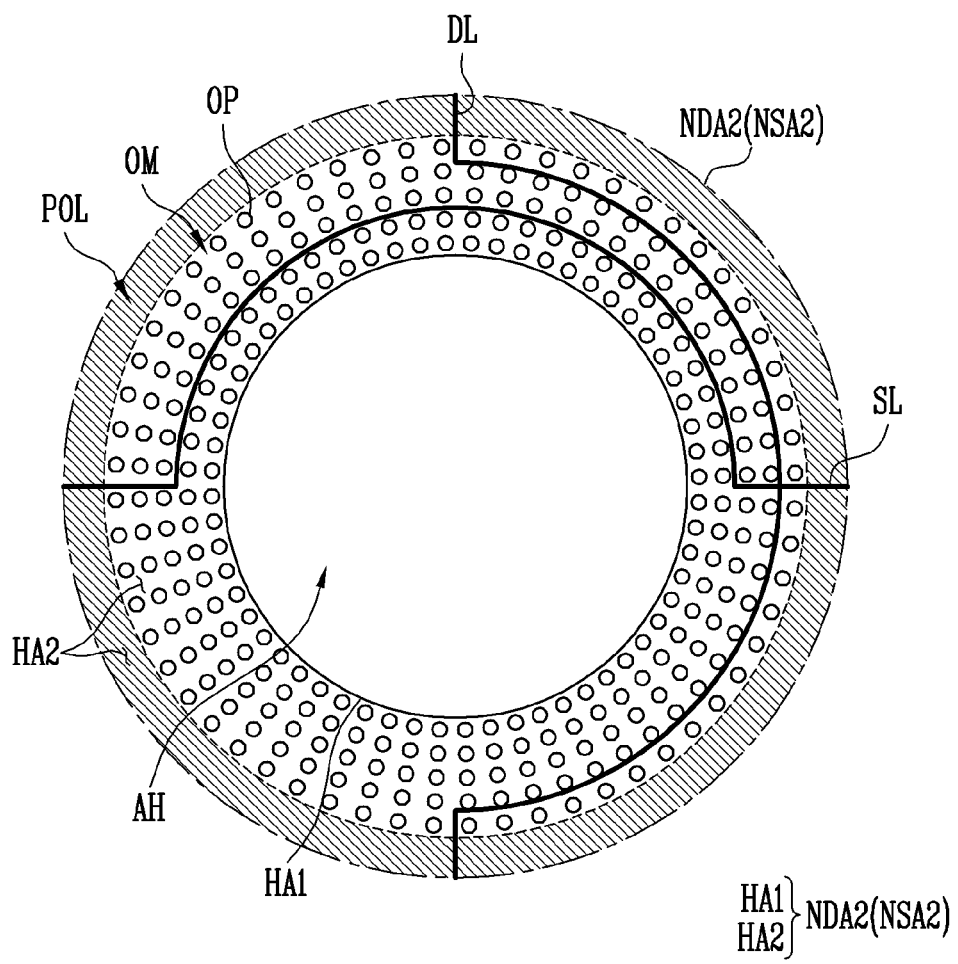
FIG. 7 is an enlarged view illustrating an example of the second non-display area of the display device of FIG. 2.
Figure 7:
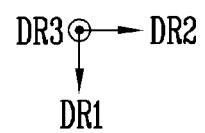

FIG. 7 is an enlarged view illustrating an example of the second non-display area of the display device of FIG. 2.

Referring to FIGS. 2 to 5 and FIG. 7, a second non-sensing area NSA2 (or a second non-display area NDA2) may include a first area HA1 and a second area HA2.

The hole AH may be formed in the first area HA1. The hole AH may include the first through hole TH1 and the second through hole TH2, which were described with reference to FIGS. 3 to 5.

In the second area HA2, a data line DL and a scan line SL may be formed on the pixel circuit layer PCL of the display panel DP by detouring around the hole AH.

In an embodiment, an optical pattern OM may be formed on an optical structure OS in the touch sensor TS layer in the second area HA2 in order to prevent the data line DL and the scan line SL detouring around the hole AH from being visible to a user.

In an embodiment, the optical pattern OM may include a plurality of openings OP. The optical pattern OM causes scattering of light incident to the upper surface and the lower surface of the optical structure OS (or a touch sensor TS) by including the plurality of openings OP, thereby decreasing the reflectivity of incident light. For example, the reflectivity of light incident from the outside to the upper surface of the optical structure OS (or the touch sensor TS) through the hole AH is decreased through the optical pattern OM, whereby the reflectivity of light in the vicinity of the hole AH (that is, in the second area HA2) may be decreased. Accordingly, lines (e.g., the data line DL, the scan line SL, and the like) under the optical structure OS (or the touch sensor TS) in the vicinity of the hole AH and reflected light in the vicinity of the hole AH may not be visible to a user.

Also, when light from the outside is again reflected from the sensor module 300 and is then incident to the lower surface of the optical structure OS (or the touch sensor TS) through the hole AH, the reflectivity of light incident to the lower surface of the optical structure OS (or the touch sensor TS) is decreased through the optical pattern OM, whereby the amount of light that again enters the sensor module 300 by being reflected from the lower surface of the optical structure OS (or the touch sensor TS) may be reduced. Accordingly, a flare phenomenon of a captured image, which is caused by light again entering the camera included in the sensor module 300, may be reduced.

A polarization layer POL may be disposed in at least a part of the second area HA2. When the polarization layer POL is aligned to one side in the alignment process, a part of the polarization layer POL may be disposed in the first area HAL in which the hole AH is formed. Therefore, in order to prevent a part of the polarization layer POL from being disposed in the first area HAL the polarization layer POL may be disposed outside the second area HA2 or in a part of the second area HA2.

Figure 8:
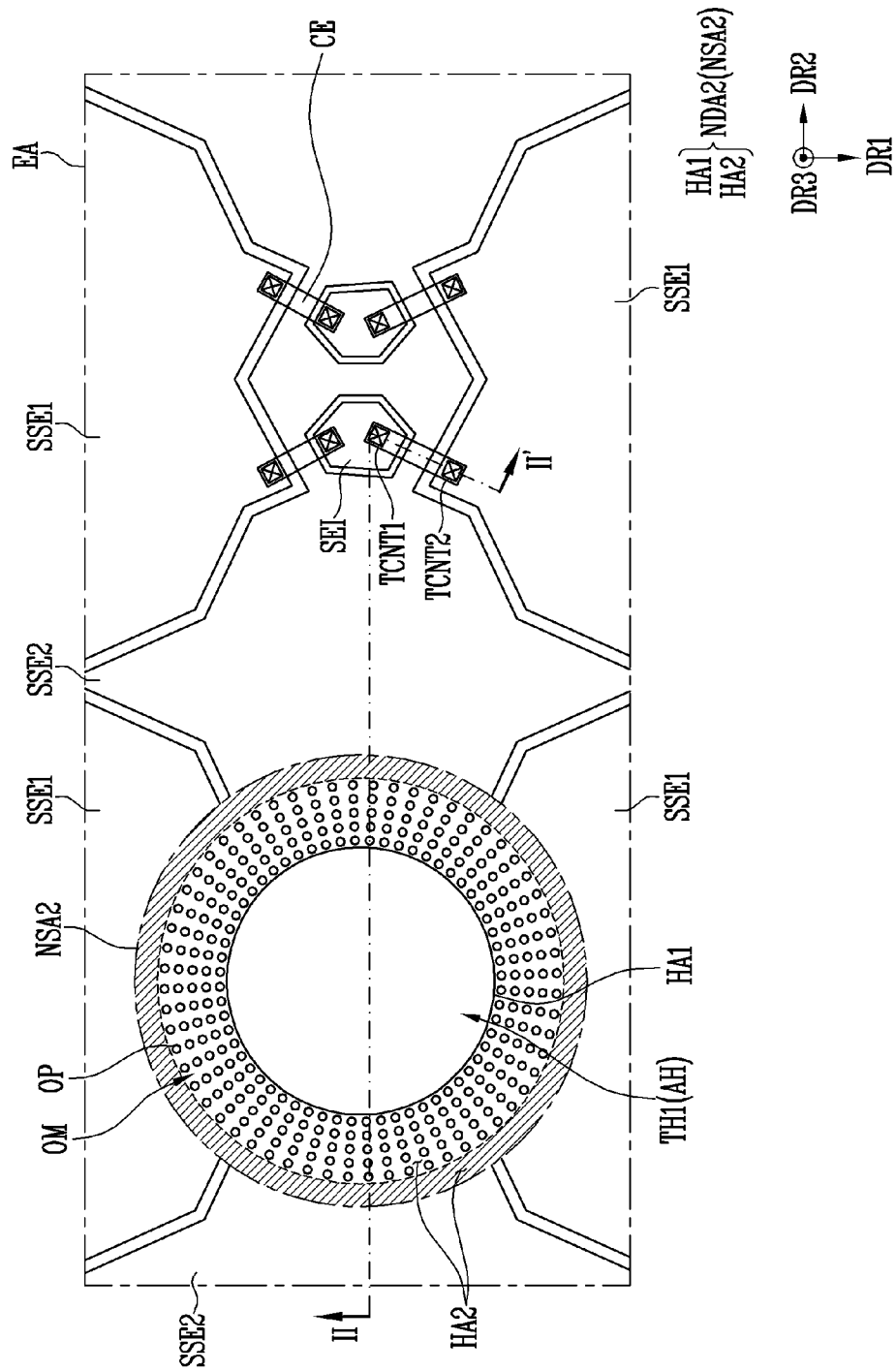
FIG. 8 is an enlarged view illustrating an example of the enlarged area EA part of the touch sensor, the optical structure, and the base layer of FIG. 4.

FIG. 8 is an enlarged view illustrating an example of an enlarged area EA part of the touch sensor, the optical structure, and the base layer of FIG. 4, and FIGS. 9A to 9E are cross-sectional views schematically illustrating examples taken along line II-IP of the enlarged area EA part of FIG. 8. The adhesive layer ADL described with reference to FIG. 5 is illustrated in FIGS. 9A to 9E for the convenience of description.

Referring to FIG. 8 and FIG. 9A, a touch sensor TS may be disposed on the sensing area SA of a base layer BSL. The touch sensor TS may include a first electrode layer 910, a second electrode layer 920, a first insulation layer INS1, and a second insulation layer INS2.

The first electrode layer 910 may be disposed on the sensing area SA of the base layer BSL. In an embodiment, the first electrode layer 910 may be formed of an opaque metal conductive layer, for example, a single layer or multiple layers formed of any one of molybdenum (Mo), niobium (Nb), aluminum (Al), chromium (Cr), gold (Au), titanium (Ti), nickel (Ni), neodymium (Nd), and copper (Cu), or an alloy thereof.

The first electrode layer 910 may include a coupling electrode CE disposed in the sensing area SA. Because the coupling electrode CE is formed of an opaque metal conductive layer, it does not overlap the pixel (PX of FIG. 3). This non-overlap prevents an opening ratio of the pixel (PX of FIG. 3) from decreasing, but the coupling electrode CE may be disposed so as to overlap a pixel definition layer.

The coupling electrode CE may function to couple a first sensing electrode SSE1 to a touch island electrode SEI. That is, the coupling electrode CE may be coupled to the touch island electrode SEI through a first touch contact hole TCNT1, which is configured to expose the touch island electrode SEI by penetrating through the first insulation layer INS1. The coupling electrode CE may be coupled to the first sensing electrode SSE1 through a second touch contact hole TCNT2, which is configured to expose the first sensing electrode SSE1 by penetrating through the first insulation layer INS1. Accordingly, the first sensing electrode SSE1 and the touch island electrode SEI may be electrically coupled to each other through the coupling electrode CE.

In an embodiment, the first electrode layer 910 may not be disposed in a second non-sensing area NSA2.

The first insulation layer INS1 may be disposed on the first electrode layer 910, which is disposed in the sensing area SA. In an embodiment, the first insulation layer INS1 may be disposed on a part of the sensing area SA of the base layer BSL (the area in which the first electrode layer 910 is not disposed) and the first electrode layer 910. The first insulation layer INS1 may be disposed so as to cover the first electrode layer 910. The first insulation layer INS1 may insulate the touch island electrode SEI from the first sensing electrode SSE1.

In an embodiment, a third insulation layer INS3 may be disposed on the base layer BSL in the second area HA2 of the second non-sensing area NSA2. Here, the first insulation layer INS1 and the third insulation layer INS3 may be formed as a single body. That is, the first insulation layer INS1 (or the third insulation layer INS3) may extend from the sensing area SA to the second area HA2.

The first insulation layer INS1 may include an inorganic film, for example, at least one of silicon nitride, silicon oxynitride, silicon oxide, titanium oxide, and aluminum oxide. Because the third insulation layer INS3 and the first insulation layer INS1 are formed as a single body, the third insulation layer INS3 may include the same material as the first insulation layer INS1.

The second electrode layer 920 may be disposed on the first insulation layer INS1. The second electrode layer 920 may include a transparent conductive material capable of transmitting light. For example, the second electrode layer 920 may include a transparent conductive material, such as indium tin oxide (ITO), indium zinc oxide (IZO), or the like.

The second electrode layer 920 may include the first sensing electrode SSE1, a second sensing electrode SSE2, and the touch island electrode SEI, which are disposed in the sensing area SA so as to be spaced apart from each other. Because the first sensing electrode SSE1, the second sensing electrode SSE2, and the touch island electrode SEI include a transparent conductive material, even though the first sensing electrode SSE1, the second sensing electrode SSE2, and the touch island electrode SEI overlap the pixel (PX of FIG. 3), the opening ratio of the pixel (PX of FIG. 3) may not be decreased.

The first sensing electrode SSE1 and the touch island electrode SEI may be alternately disposed along the first direction DR1, but may be disposed so as to be spaced apart from each other. The first sensing electrode SSE1 and the touch island electrode SEI that are close to each other may be electrically coupled to each other by the coupling electrode CE.

In the second area HA2 of the second non-sensing area NSA2, the second electrode layer 920 may include an optical pattern OM disposed therein. That is, the optical pattern OM may be disposed on the same layer as the first sensing electrode SSE1, the second sensing electrode SSE2, and the touch island electrode SEI, which are disposed in the sensing area SA. In an embodiment, the optical pattern OM may be formed in the same process as the second electrode layer 920, that is, the first sensing electrode SSE1, the second sensing electrode SSE2, and the touch island electrode SEI, and may include the same material (e.g., the same metal material) as the first sensing electrode SSE1, the second sensing electrode SSE2, and the touch island electrode SEI.

The optical pattern OM may be disposed on the third insulation layer INS3 in the second area HA2.

The second insulation layer INS2 may be disposed on the second electrode layer 920 (that is, the first sensing electrode SSE1, the second sensing electrode SSE2, and the touch island electrode SEI) disposed in the sensing area SA. In an embodiment, the second insulation layer INS2 may be disposed on the second electrode layer 920 and in a part of the area in which the first insulation layer INS1 is disposed in the sensing area SA (the area in which the second electrode layer 920 is not disposed). The second insulation layer INS2 is disposed so as to cover the second electrode layer 920, thereby insulating the second electrode layer 920.

In an embodiment, a fourth insulation layer INS4 may be disposed in the second area HA2 of the second non-sensing area NSA2. Here, the second insulation layer INS2 and the fourth insulation layer INS4 may be formed as a single body. That is, the second insulation layer INS2 (or the fourth insulation layer INS4) may be disposed by extending from the sensing area SA to the second area HA2.

In an embodiment, the fourth insulation layer INS4 may cover the optical pattern OM in the second area HA2. Accordingly, the optical pattern OM may be prevented from being damaged.

The second insulation layer INS2 may be formed of an inorganic film, for example, silicon nitride, silicon oxynitride, silicon oxide, titanium oxide, or aluminum oxide. Because the fourth insulation layer INS4 and the second insulation layer INS2 are formed as a single body, the fourth insulation layer INS4 may include the same material as the second insulation layer INS2.

In an embodiment, the optical pattern OM may include a plurality of openings OP. As described above with reference to FIG. 7, because the optical pattern OM includes the plurality of openings OP, scattering of light incident to the upper surface and the lower surface of the optical structure OS (or the touch sensor TS) is caused, whereby the reflectivity of incident light may be decreased. To this end, the refractive index of the second electrode layer 920 in which the optical pattern OM is included may be higher than the refractive index of the second insulation layer INS2 (or the fourth insulation layer INS4) that covers the second electrode layer 920. Also, the refractive index of the second electrode layer 920 in which the optical pattern OM included may be higher than the refractive index of the first insulation layer INS1 (or the third insulation layer INS3) disposed under the second electrode layer 920.

For example, the difference between the refractive index of the second electrode layer 920 and that of the first insulation layer INS1 (or the difference between the refractive index of the second electrode layer 920 and that of the second insulation layer INS2) may be equal to or higher than about 0.3. For example, when the second electrode layer 920 is formed of ITO and when the first insulation layer INS1 (or the second insulation layer INS2) includes silicon oxide (e.g., $SiO_2$), because the refractive index of ITO is about 1.85 and the refractive index of $SiO_2$ is about 1.45, the difference therebetween may be about 0.40.

In this case, diffused reflection is caused depending on a difference in the refractive index in the plurality of openings OP included in the optical pattern OM, which causes scattering of light in the optical pattern OM, whereby the reflectivity of light incident to the upper surface and the lower surface of the optical structure OS (or the touch sensor TS) may be decreased. Accordingly, lines (e.g., a data line DL, a scan line SL, and the like) under the optical structure OS (or the touch sensor TS) in the vicinity of the hole AH and reflected light in the vicinity of the hole AH may be prevented from being visible to a user, and the flare phenomenon of a sensor module (e.g., a camera) disposed under the display panel (DP of FIG. 5) may be reduced.

In an embodiment, the planar shapes of the openings OP of the optical pattern OM may be a circle or an ellipse. Also, without limitation thereto, the planar shapes of the openings OP may be a polygon or the like.

Figure 9B:
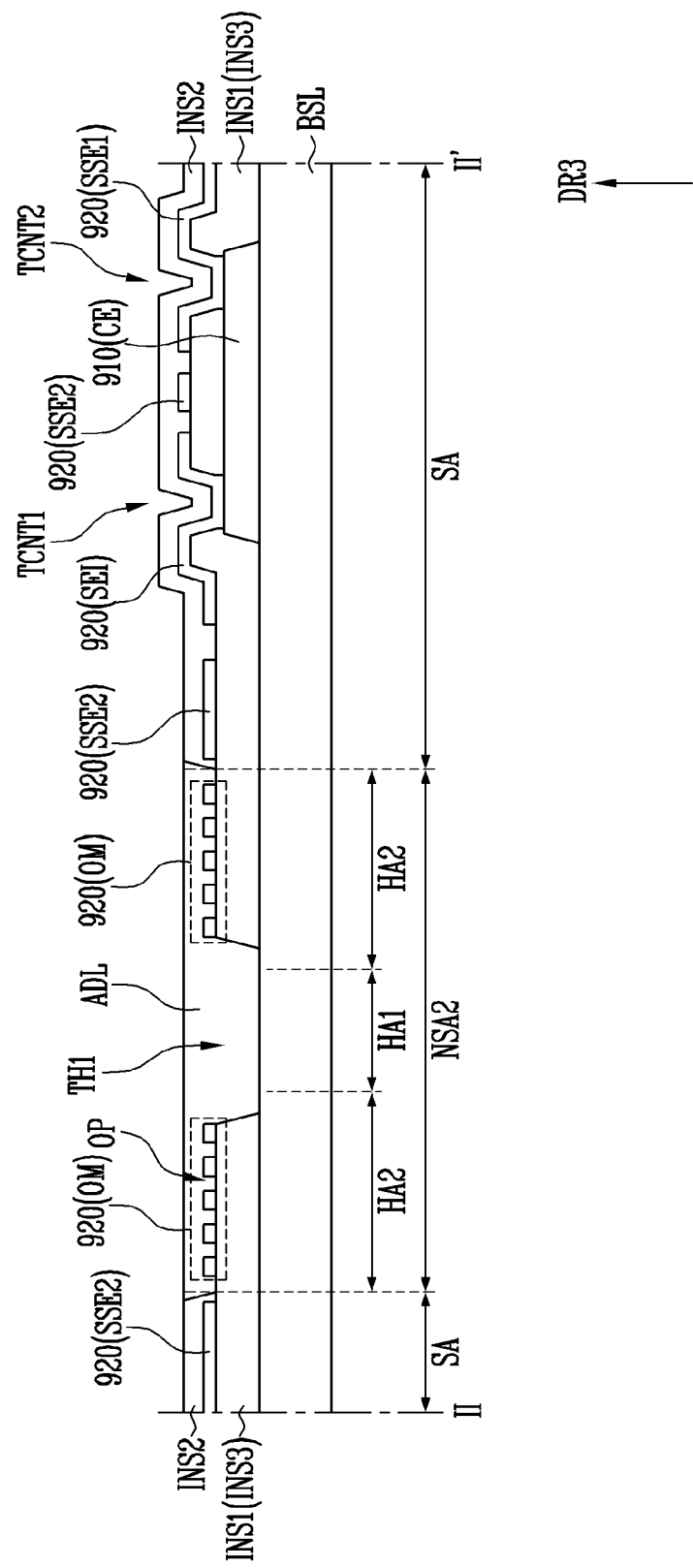

Referring to FIG. 9A and FIG. 9B, the cross-sectional view of FIG. 9B is the same as the cross-sectional view of FIG. 9A except that a fourth insulation layer INS4 (or a second insulation layer INS2) is not disposed in the second area HA2 in the cross-sectional view of FIG. 9B. Therefore, a repeated description will be omitted.

Referring to FIG. 8 and FIG. 9B, because a fourth insulation layer INS4 is not formed on the second electrode layer 920 formed in the second area HA2 of the second non-sensing area NSA2, that is, because the fourth insulation layer INS4 is not formed on the optical pattern OM, an adhesive layer ADL may be disposed so as to cover the optical pattern OM. Here, the refractive index of the second electrode layer 920 forming the optical pattern OM may be higher than the refractive index of the adhesive layer ADL. For example, when the second electrode layer 920 is formed of ITO and when the adhesive layer ADL is formed of OCA, because the refractive index of ITO is about 1.85 and the refractive index of OCA is about 1.50, the difference therebetween may be about 0.35. The difference between the refractive index of the optical pattern OM and that of the adhesive layer ADL causes scattering of light in the optical pattern OM, whereby the reflectivity of light incident to the upper surface and the lower surface of the touch sensor TS may be decreased.

Referring to FIG. 6, FIG. 8 and FIG. 9B, because the hole AH' is formed by penetrating through the window layer WDL' in the display device DD' of FIG. 6, the optical pattern OM may be exposed to the outside, rather than being covered by the adhesive layer ADL. In this case, because the refractive index of the outside is about 1.00, even though not the second electrode layer 920 but the optical pattern OM is disposed on the same layer as the second insulation layer INS2 by being formed in the same process as the second insulation layer INS2, scattering of light in the optical pattern OM is caused by the difference between the refractive index of the optical pattern OM and that of the outside, whereby the reflectivity of light incident to the upper surface and the lower surface of the optical structure (or the touch sensor TS) may be decreased. For example, when the second insulation layer INS2 includes silicon oxide (e.g., $SiO_2$), because the refractive index of $SiO_2$ is about 1.45 and the refractive index of the outside is about 1.00, the difference therebetween may be about 0.45.

Figure 9C:
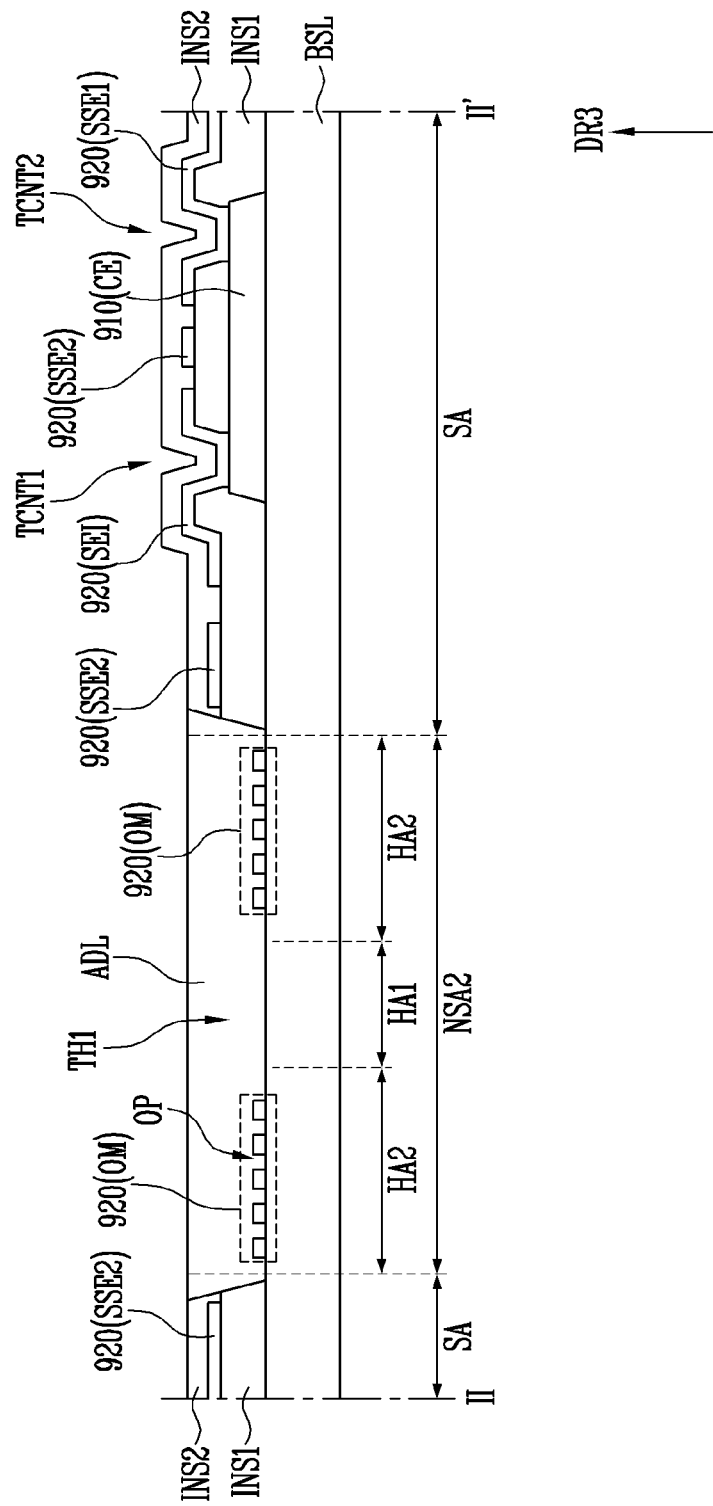

Referring to FIG. 9B and FIG. 9C, the cross-sectional view of FIG. 9C is the same as the cross-sectional view of FIG. 9B except that a third insulation layer INS3 (or a first insulation layer INS1) is not formed in the second area HA2 in the cross-sectional view of FIG. 9C. Therefore, a repeated description will be omitted.

Referring to FIG. 8 and FIG. 9C, a third insulation layer INS3 is not formed under the second electrode layer 920 formed in the second area HA2 of the second non-sensing area NSA2, that is, under the optical pattern OM. That is, the optical pattern OM may be disposed directly on the base layer BSL. As described above, even though the optical structure OS does not include the third insulation layer INS3 in the second area HA2, scattering of light in the optical pattern OM is caused by the difference between the refractive index of the optical pattern OM and that of the adhesive layer ADL, which is formed so as to cover the optical pattern OM, whereby the reflectivity of light incident to the upper surface and the lower surface of the optical structure OS (or the touch sensor TS) may be decreased.

Although the adhesive layer ADL is illustrated as covering the optical pattern OM in FIG. 9C, the configuration is not limited thereto. For example, the second insulation layer INS2 may cover the optical pattern OM by being disposed so as to extend from the sensing area SA to the second area HA2. That is, the optical structure OS may include a fourth insulation layer INS4 configured to cover the optical pattern OM. In this case, scattering of light in the optical pattern OM is caused by the difference between the refractive index of the optical pattern OM and that of the fourth insulation layer INS4 formed so as to cover the optical pattern OM, whereby the reflectivity of light incident to the upper surface and the lower surface of the optical structure OS (or the touch sensor TS) may be decreased.

Referring to FIG. 6, FIG. 8 and FIG. 9C, because the hole AH' is formed by penetrating through the window layer WDL' in the display device DD' of FIG. 6, the optical pattern OM may be exposed to the outside, rather than being covered by the adhesive layer ADL. In this case, because the refractive index of the outside is about 1.00, even though not the second electrode layer 920 but the optical pattern OM is disposed on the same layer as the first insulation layer INS1 or the second insulation layer INS2 by being formed in the same process as the first insulation layer INS1 or the second insulation layer INS2, scattering of light in the optical pattern OM is caused by the difference between the refractive index of the optical pattern OM and that of the outside, whereby the reflectivity of light incident to the upper surface and the lower surface of the optical structure OS (or the touch sensor TS) may be decreased. For example, when the first insulation layer INS1 or the second insulation layer INS2 includes silicon oxide (e.g., $SiO_2$), because the refractive index of $SiO_2$ is about 1.45 and the refractive index of the outside is about 1.00, the difference therebetween may be about 0.45.

Figure 9D:
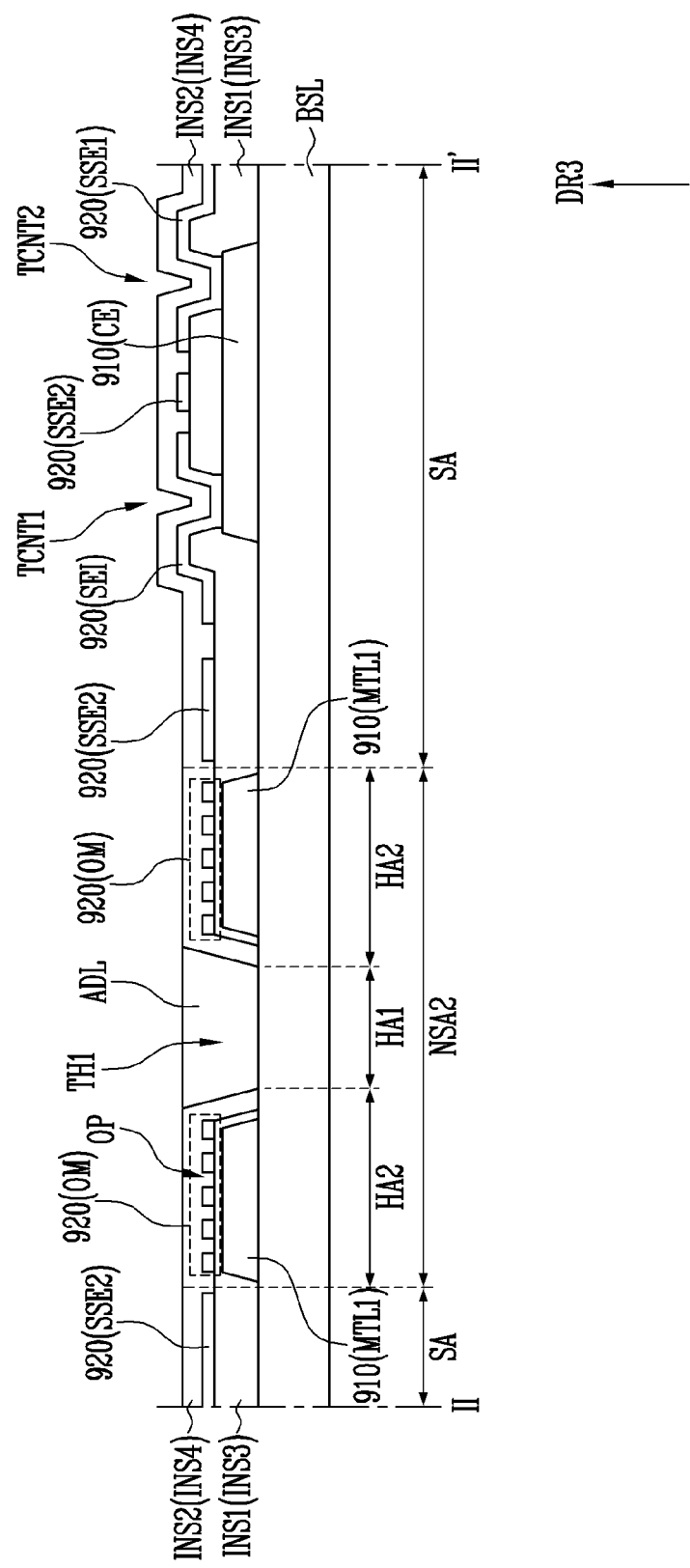

Referring to FIG. 9A and FIG. 9D, the cross-sectional view of FIG. 9D is the same as the cross-sectional view of FIG. 9A except that a first metal layer MTL1 is additionally formed in the second area HA2 in the cross-sectional view of FIG. 9D. Therefore, a repeated description will be omitted.

Referring to FIG. 8 and FIG. 9D, the first electrode layer 910 may further include a first metal layer MTL1 disposed in the second area HA2. The first metal layer MTL1 may be disposed on the second area HA2 of the base layer BSL. Also, the optical structure OS may include a third insulation layer INS3 configured to cover the first metal layer MTL1. That is, the first metal layer MTL1 and the coupling electrode CE formed in the sensing area SA may be disposed on the same layer. That is, the first metal layer MTL1 may be formed in the same process as the coupling electrode CE, and may include the same material (e.g., the same metal material) as the coupling electrode CE.

As described above, the optical structure OS may further include the first metal layer MTL1 disposed on the second area HA2 of the base layer BSL. Here, the reflectivity of light incident to the lower surface of the optical structure OS (or the touch sensor TS) may be further decreased by the first metal layer MTL1. Accordingly, the flare phenomenon of a captured image, which is caused by light again entering the camera included in the sensor module 300, may be further reduced.

The fourth insulation layer INS4 is illustrated as covering the optical pattern OM in FIG. 9D, but without limitation thereto, the fourth insulation layer INS4 is not disposed in the second area HA2 and the adhesive layer ADL may cover the optical pattern OM, as described with reference to FIG. 9B.

The first metal layer MTL1 may include a main metal layer, a first metal oxide film, and a second metal oxide film. These will be described later with reference to FIG. 11.

Figure 9E:
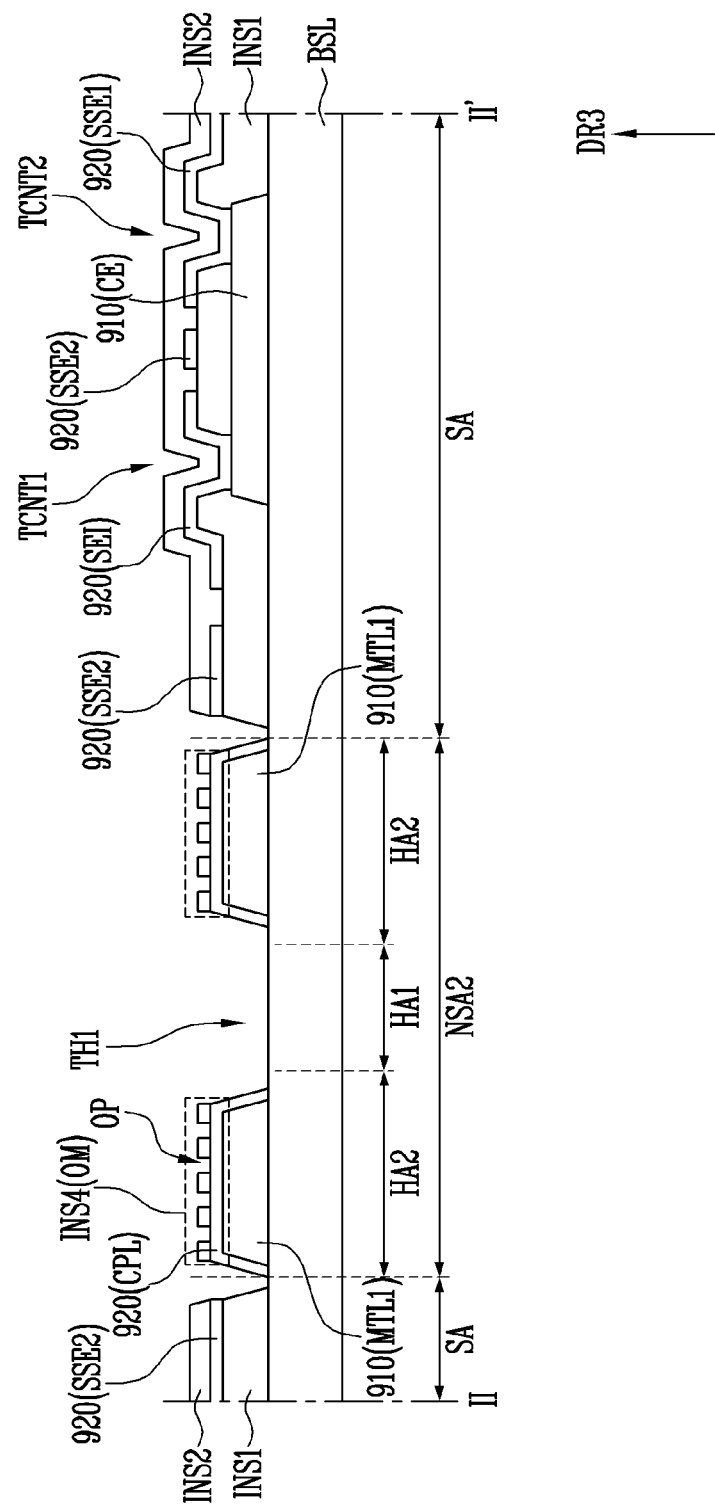

Referring to FIG. 9C and FIG. 9E, the cross-sectional view of FIG. 9E is the same as the cross-sectional view of FIG. 9C except that the adhesive layer ADL is not included, the optical pattern OM is disposed on the same layer as the second insulation layer INS2, and a first metal layer MTL1 and a capping layer CPL are further included in the cross-sectional view of FIG. 9E. Therefore, a repeated description will be omitted.

Referring to FIG. 6, FIG. 8 and FIG. 9E, the hole AH' may be formed by penetrating through the window layer WDL' and the adhesive layer ADL' as described with reference to FIG. 6.

In an embodiment, the first electrode layer 910 may include a first metal layer MTL1 formed in the second area HA2 of the second non-sensing area NSA2. The first metal layer MTL1 may be disposed on the second area HA2 of the base layer BSL. Also, a capping layer CPL may cover the first metal layer MTL1. The first metal layer MTL1 and the coupling electrode CE, which is formed in the sensing area SA, may be disposed on the same layer. That is, the first metal layer MTL1 may be formed in the same process as the coupling electrode CE, and may include the same material (e.g., the same metal material) as the coupling electrode CE. Also, the capping layer CPL and the second electrode layer 920 may be disposed on the same layer. That is, the capping layer CPL may be formed in the same process as the second electrode layer 920, and may include the same material (e.g., the same metal material) as the second electrode layer 920. Because the second electrode layer 920 forming the capping layer CPL is formed of metal oxide, such as ITO, IZO, or the like, the first metal layer MTL1 may be prevented from being oxidized.

Also, the reflectivity of light incident to the upper surface of the optical structure OS (or the touch sensor TS) may be further decreased by the capping layer CPL formed of the second electrode layer 920.

As described above, the optical structure OS further includes the first metal layer MTL1 disposed on the base layer BSL, whereby the reflectivity at the lower surface of the optical structure OS (or the touch sensor TS) may be further decreased. Accordingly, the flare phenomenon of a captured image, which is caused by light again entering the camera included in the sensor module 300, may be further reduced.

The optical pattern OM may be disposed on the capping layer CPL.

In an embodiment, the optical pattern OM is formed of the fourth insulation layer INS4, and the optical pattern OM may be disposed on the same layer as the second insulation layer INS2. Because the display device DD' of FIG. 6 is configured such that the hole AH' is formed by penetrating through the window layer WDL', the optical pattern OM may be exposed to the outside, rather than being covered by the adhesive layer ADL. In this case, because the refractive index of the outside is about 1.00, even though the optical pattern OM is disposed on the same layer as the second insulation layer INS2 by being formed in the same process as the second insulation layer INS2, scattering of light in the optical pattern OM is caused by the difference between the refractive index of the optical pattern OM and that of the outside, whereby the reflectivity of light incident to the upper surface and the lower surface of the optical structure OS (or the touch sensor TS) may be decreased.

As described above with reference to FIGS. 9A to 9E, the optical pattern OM causes scattering of light incident to the upper surface and the lower surface of the optical structure OS (or the touch sensor TS) in the vicinity of the hole AH by including the plurality of openings OP, whereby the reflectivity of incident light may be decreased. Accordingly, lines (e.g., the data line DL, the scan line SL, and the like) under the optical structure OS (or the touch sensor TS) in the vicinity of the hole AH and reflected light in the vicinity of the hole AH may not be visible to a user.

In an embodiment, the optical pattern OM may be omitted in FIG. 9E. In this case, even though the optical pattern OM is not included, the reflectivity of light incident to the upper surface and the lower surface of the optical structure OS (or the touch sensor TS) may be decreased by the first metal layer MTL1 and the capping layer CPL.

Figure 10:
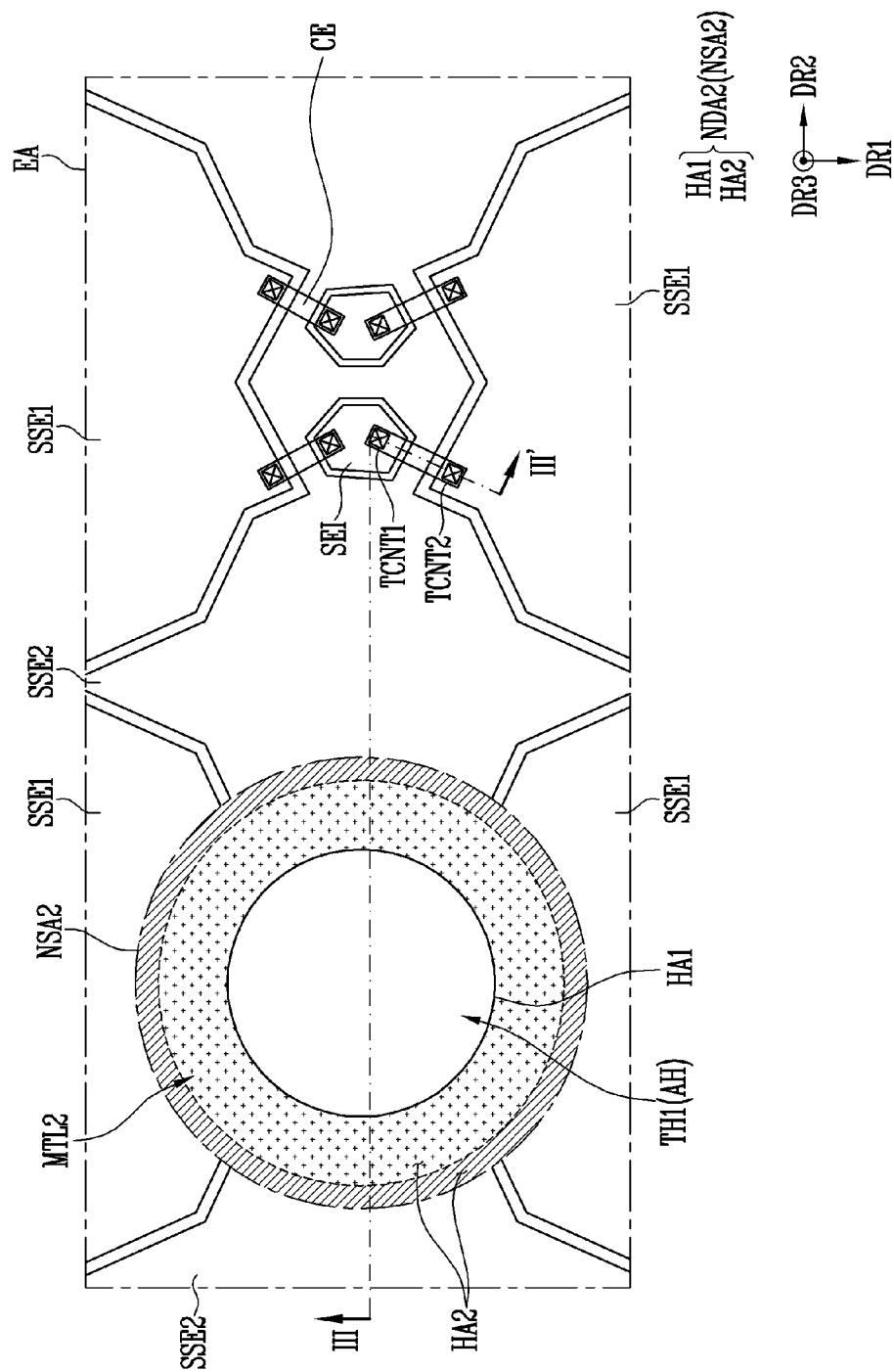
FIG. 10 is an enlarged view illustrating another example of the enlarged area EA part of the touch sensor, the optical structure, and the base layer of FIG. 4.
Figure 11:
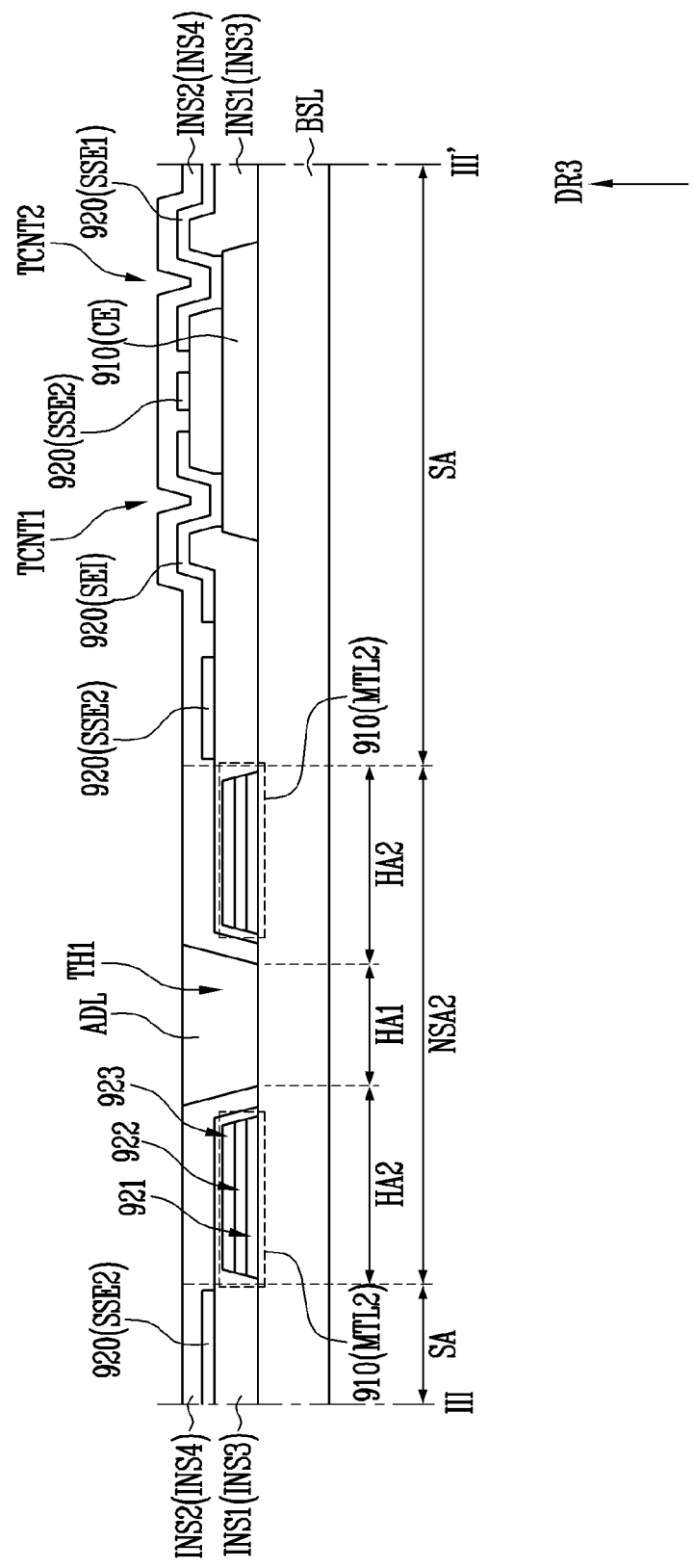
FIG. 11 is a cross-sectional view schematically illustrating an example of the enlarged area EA part of FIG. 10, taken along line III-III'.

FIG. 10 is an enlarged view illustrating another example of the enlarged area EA part of the touch sensor, the optical structure, and the base layer of FIG. 4, and FIG. 11 is a cross-sectional view schematically illustrating an example taken along line of the enlarged area EA part of FIG. 10.

Referring to FIG. 8 and FIG. 10, the view of the enlarged area EA part of FIG. 10 is the same as the view of the enlarged area EA part of FIG. 8 except that the optical pattern OM is not illustrated and a second metal layer MTL2 is illustrated in the view of the enlarged area EA part of FIG. 10. Therefore, a repeated description will be omitted.

Referring to FIG. 10 and FIG. 11, the first electrode layer 910 may include a second metal layer MTL2. The second metal layer MTL2 may be disposed on the second area HA2 of the base layer BSL. That is, the second metal layer MTL2 is included in the optical structure OS, and the second metal layer MTL2 may be disposed on the same layer as the first electrode layer 910 disposed in the sensing area SA. In an embodiment, the optical pattern OM may be formed in the same process as the first electrode layer 910, and may include the same material (e.g., the same metal material) as the first electrode layer 910.

In an embodiment, the second metal layer MTL2 may include a main metal layer 922, a first metal oxide film 921, and a second metal oxide film 923.

The main metal layer 922 may be formed in the same process as the coupling electrode CE, and may include the same material (e.g., molybdenum (Mo), niobium (Nb), or the like) as the material forming the coupling electrode CE.

The first metal oxide film 921 may be disposed between the base layer BSL and the main metal layer 922. The second metal oxide film 923 may be disposed between the main metal layer 922 and the third insulation layer INS3.

In an embodiment, the first metal oxide film 921 and the second metal oxide film 923 are formed in the same process as the coupling electrode CE, and may be formed of a compound of the material forming the coupling electrode CE (e.g., metal such as molybdenum (Mo), niobium (Nb), or the like) and oxygen (e.g., metal oxide). Because the reflectivity of the first metal oxide film 921 and the second metal oxide film 923, formed of such metal oxide, is lower than the reflectivity of the main metal layer 922 formed of only metal, the reflectivity of light incident to the upper surface and the lower surface of the optical structure OS (or the touch sensor TS) may be decreased. Accordingly, lines (e.g., the data line DL, the scan line SL, and the like) under the optical structure OS (or the touch sensor TS) in the vicinity of the hole AH and reflected light in the vicinity of the hole AH may be invisible to a user, and the flare phenomenon of a sensor module (e.g., a camera) disposed under the display panel (DP of FIG. 5) may be reduced.

Also, the first metal oxide film 921 and the second metal oxide film 923 are disposed on the front surface and the back surface of the main metal layer 922, whereby the main metal layer 922 may be prevented from being oxidized.

Referring to FIG. 9D and FIG. 11, when the first metal layer MTL1 of FIG. 9D includes the main metal layer 922, the first metal oxide film 921, and the second metal oxide film 923, like the second metal layer MTL2 of FIG. 11, the reflectivity of light incident to the upper surface and the lower surface of the optical structure OS (or the touch sensor TS) may be further decreased.

A display device according to embodiments of the inventive concepts may include an optical pattern including a plurality of openings so as to surround a through hole. Accordingly, scattering of light incident to the upper surface and the lower surface of a touch sensor in the vicinity of the through hole is caused, whereby the reflectivity of light in the vicinity of the through hole may be decreased.

Also, the display device according to embodiments of the inventive concepts includes a second metal layer including a first metal oxide film and a second metal oxide film in a second area (in the vicinity of the through hole), whereby the reflectivity of light incident to the upper surface and the lower surface of the touch sensor in the vicinity of the through hole may be decreased.

Accordingly, lines under the touch sensor in the vicinity of the hole and reflected light in the vicinity of the hole may be prevented from being visible to a user, and the flare phenomenon of a sensor module (e.g., a camera) disposed under a display panel may be reduced.

Effects of the present disclosure are not limited to the above-mentioned effects, and may be variously extended without departing from the spirit and scope of the present disclosure.

The above detailed description exemplifies the present disclosure. Further, the above description merely illustrates and describes preferred embodiments of the present disclosure, and the present disclosure can be used under various combinations, changes, and environments. That is, modifications and changes may be made without departing from the scope of the concept of the present disclosure described in the present specification, equivalents thereof, and/or the scope of technology or knowledge to which the present disclosure pertains. Therefore, the detailed description of the present disclosure does not intend to limit the present disclosure to the disclosed embodiments. Further, it should be appreciated that the appended claims include even another embodiment.

What is claimed is:

1. A display device, comprising:
a base layer including a non-sensing area and a sensing area configured to surround the non-sensing area;
a touch sensor disposed on the sensing area of the base layer;
an optical structure disposed on the base layer; and
a polarization layer disposed on the touch sensor so as to overlap the sensing area,
wherein:
the touch sensor and the optical structure define a first through hole located in the non-sensing area,
the non-sensing area includes a first area corresponding to the first through hole and a second area configured to surround the first area, and
the optical structure comprises an optical pattern disposed in the second area and including a plurality of openings.

2. The display device according to claim 1, wherein:
the touch sensor comprises a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer,
among the first sensing electrodes, the first sensing electrodes adjacent to each other are coupled to the second electrode layer by penetrating through the first insulation layer, and
the optical pattern is disposed on a layer identical to the second electrode layer.

3. The display device according to claim 2, wherein:
the optical structure further comprises a third insulation layer disposed on the second area of the base layer,
the first insulation layer and the third insulation layer are formed as a single body, and
the optical pattern is disposed on the third insulation layer.

4. The display device according to claim 3, wherein:
the optical structure further comprises a fourth insulation layer configured to cover the optical pattern,
the second insulation layer and the fourth insulation layer are formed as a single body, and
a refractive index of the fourth insulation layer is lower than a refractive index of the optical pattern.

5. The display device according to claim 2, wherein the second electrode layer and the optical pattern include an identical metal material.

6. The display device according to claim 2, wherein:
the optical structure further comprises a metal layer disposed on the second area of the base layer and a third insulation layer configured to cover the metal layer,
the first insulation layer and the third insulation layer are formed as a single body, and
the metal layer is disposed on a layer identical to the first electrode layer.

7. The display device according to claim 6, wherein:
the optical structure further comprises a fourth insulation layer configured to cover the optical pattern, and
the second insulation layer and the fourth insulation layer are formed as a single body.

8. The display device according to claim 6, wherein the optical structure further comprises a first metal oxide film disposed between the base layer and the metal layer and a second metal oxide film disposed between the metal layer and the third insulation layer.

9. The display device according to claim 6, wherein the first electrode layer and the metal layer include an identical metal material.

10. The display device according to claim 8, wherein the first metal oxide film, the second metal oxide film, and the metal layer include an identical metal material.

11. The display device according to claim 1, wherein:
the touch sensor comprises a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer,
among the first sensing electrodes, the first sensing electrodes adjacent to each other are coupled to the second electrode layer by penetrating through the first insulation layer, and
the optical pattern is formed on a layer identical to the second insulation layer.

12. The display device according to claim 11, wherein:
the optical structure further comprises a metal layer disposed on the second area of the base layer and a capping layer configured to cover the metal layer,
the metal layer is disposed on a layer identical to the first electrode layer,
the capping layer is disposed on a layer identical to the second electrode layer,
the optical pattern is disposed on the capping layer, and
the second insulation layer and the optical pattern include an identical material.

13. The display device according to claim 1, further comprising:
a window layer disposed on the polarization layer and the touch sensor; and
an adhesive layer configured to bond the polarization layer to the window layer in the sensing area and to bond the optical structure to the window layer in the non-sensing area.

14. The display device according to claim 13, wherein:
the adhesive layer covers the optical pattern, and
a refractive index of the adhesive layer is lower than a refractive index of the optical pattern.

15. The display device according to claim 1, further comprising:
a window layer disposed on the polarization layer so as to overlap the sensing area; and
an adhesive layer configured to bond the polarization layer to the window layer,
wherein at least a part of the optical pattern is exposed to an outside.

16. The display device according to claim 1, further comprising:
- a substrate including a non-display area, corresponding to the non-sensing area, and a display area, corresponding to the sensing area;
- a display element layer disposed between a first surface of the substrate and the base layer and configured to define a second through hole corresponding to the first through hole; and
- a sensor module disposed on a second surface, which faces the first surface of the substrate, so as to correspond to at least a part of the first area.

17. A display device, comprising:
- a base layer including a non-sensing area and a sensing area configured to surround the non-sensing area;
- a touch sensor disposed on the sensing area of the base layer;
- an optical structure disposed on the base layer; and
- a polarization layer disposed on the touch sensor so as to overlap the sensing area, wherein:
- the touch sensor and the optical structure define a first through hole located in the non-sensing area,
- the non-sensing area includes a first area corresponding to the first through hole and a second area configured to surround the first area, and
- the optical structure comprises a first metal oxide film disposed on the second area of the base layer, a metal layer disposed on the first metal oxide film, and a second metal oxide film disposed on the metal layer.

18. The display device according to claim 17, wherein:
- the touch sensor comprises a first electrode layer disposed on the sensing area of the base layer, a first insulation layer disposed on the sensing area of the base layer and the first electrode layer, a second electrode layer disposed on the first insulation layer and including first sensing electrodes and second sensing electrodes, which are arranged so as to be spaced apart from each other, and a second insulation layer disposed on the first insulation layer and the second electrode layer,
- among the first sensing electrodes, the first sensing electrodes adjacent to each other are coupled to the second electrode layer by penetrating through the first insulation layer, and
- the metal layer, the first metal oxide film, and the second metal oxide film are disposed on a layer identical to the first electrode layer.

19. The display device according to claim 18, wherein:
- the optical structure further comprises a third insulation layer disposed on the second area of the base layer,
- the first insulation layer and the third insulation layer are formed as a single body, and
- the third insulation layer covers the second metal oxide film.

20. The display device according to claim 18, wherein the metal layer, the first metal oxide film, the second metal oxide film, and the first electrode layer include an identical metal material.

* * * * *